(12) United States Patent
Hiramatsu et al.

(10) Patent No.: US 6,960,743 B2
(45) Date of Patent: Nov. 1, 2005

(54) CERAMIC SUBSTRATE FOR SEMICONDUCTOR MANUFACTURING, AND METHOD OF MANUFACTURING THE CERAMIC SUBSTRATE

(75) Inventors: Yasuji Hiramatsu, Gifu (JP); Yasutaka Ito, Gifu (JP)

(73) Assignee: Ibiden Co., Ltd., Ogaki ( * ) Notice: Subject to any disclaimer, the term of this patent is extended or adjusted under 35 U.S.C. 154(b) by 0 days.

(21) Appl. No.: 10/398,393

(22) PCT Filed: Dec. 5, 2001

(86) PCT No.: PCT/JP01/10651

§ 371 (c)(1),
(2), (4) Date: Jan. 21, 2004

(87) PCT Pub. No.: WO02/47129

PCT Pub. Date: Jun. 13, 2002

(65) Prior Publication Data

US 2004/0117977 A1 Jun. 24, 2004

(30) Foreign Application Priority Data

Dec. 5, 2000 (JP) ........................................ 2000-370452

(51) Int. Cl.[7] ................................................ H05B 3/68
(52) U.S. Cl. ................................... 219/444.1; 219/546
(58) Field of Search ........................... 219/444.1, 443.1, 219/451.1, 465.1, 466.1, 468.1, 468.2, 544, 546, 547, 548; 29/614.1, 611; 118/424, 725

(56) References Cited

U.S. PATENT DOCUMENTS

| | | | | |
|---|---|---|---|---|
| 5,777,838 A | * | 7/1998 | Tamagawa et al. | 361/234 |
| 5,854,468 A | * | 12/1998 | Muka | 219/444.1 |
| 6,028,762 A | * | 2/2000 | Kamitani | 361/234 |
| 6,072,163 A | * | 6/2000 | Armstrong et al. | 219/497 |
| 6,134,096 A | * | 10/2000 | Yamada et al. | 361/234 |
| 6,465,763 B1 | | 10/2002 | Ito et al. | |
| 6,475,606 B2 | | 11/2002 | Niwa | |
| 6,507,006 B1 | | 1/2003 | Hiramatsu et al. | |
| 2003/0203225 A1 | | 10/2003 | Hiramatsu et al. | |
| 2004/0007773 A1 | | 1/2004 | Hiramatsu et al. | |
| 2004/0011781 A1 | | 1/2004 | Ito et al. | |
| 2004/0011782 A1 | | 1/2004 | Ito et al. | |
| 2004/0011797 A1 | | 1/2004 | Hiramatsu et al. | |
| 2004/0016746 A1 | | 1/2004 | Ito et al. | |
| 2004/0045951 A1 | | 3/2004 | Ito et al. | |

(Continued)

FOREIGN PATENT DOCUMENTS

| | | |
|---|---|---|
| JP | 4-304941 | 10/1992 |
| JP | 4-364725 | 12/1992 |

(Continued)

OTHER PUBLICATIONS

U.S. Appl. No. 09/471,759, filed Dec. 23, 1999, Saito et al.
U.S. Appl. No. 09/462,067, filed Jan. 5, 2001, Furukawa et al.

(Continued)

*Primary Examiner*—Sang Y. Paik
(74) *Attorney, Agent, or Firm*—Oblon, Spivak, McClelland, Maier & Neustadt, P.C.

(57) ABSTRACT

A ceramic substrate for a semiconductor-producing/examining device, in which it is possible to promptly raise its temperature, a heating face thereof has a small temperature variation, and no semiconductor wafer and the like is damaged or distorted by thermal impact. The ceramic substrate for a semiconductor-producing/examining device has a resistance heating element formed on a surface thereof or inside thereof, wherein a projected portion for fitting a semiconductor wafer is formed along the periphery thereof and a large number of convex bodies, which make contact with the semiconductor wafer, are formed inside the projected portion.

6 Claims, 15 Drawing Sheets

U.S. PATENT DOCUMENTS

| | | |
|---|---|---|
| 2004/0060920 A1 | 4/2004 | Ito et al. |
| 2004/0065881 A1 | 4/2004 | Ito |
| 2004/0084762 A1 | 5/2004 | Hiramatsu et al. |
| 2004/0099708 A1 | 5/2004 | Hiramatsu et al. |
| 2004/0142153 A1 | 7/2004 | Niwa |
| 2004/0206746 A1 | 10/2004 | Zhou |
| 2004/0206747 A1 | 10/2004 | Ito |
| 2004/0222211 A1 | 11/2004 | Hiramatsu et al. |

FOREIGN PATENT DOCUMENTS

| | | |
|---|---|---|
| JP | 10-242256 | 9/1998 |
| JP | 11-40330 | 2/1999 |
| JP | 2000-021890 | 1/2000 |
| JP | 2000-114354 | 4/2000 |
| JP | 2000-234872 | 8/2000 |
| JP | 2000-236013 | 8/2000 |
| WO | 99/45745 | 9/1999 |

OTHER PUBLICATIONS

U.S. Appl. No. 10/345,356, filed Jan. 16, 2003, Ito.
U.S. Appl. No. 09/787,954, filed Mar. 23, 2001, Ito.
U.S. Appl. No. 09/787,816, filed Mar. 23, 2001, Ito.
U.S. Appl. No. 09/787,818, filed Mar. 23, 2001, Ito.
U.S. Appl. No. 09/806,957, filed Apr. 6, 2001, Ito et al.
U.S. Appl. No. 09/926,730, filed Apr. 16, 2001, Hiramatsu et al.
U.S. Appl. No. 09/880,742, filed Jun. 13, 2001, Saito et al.
U.S. Appl. No. 09/880,359, filed Jun. 13, 2001, Saito et al.
U.S. Appl. No. 09/880,379, filed Jun. 13, 2001, Saito et al.
U.S. Appl. No. 09/915,418, filed Jul. 27, 2001, Ito.
U.S. Appl. No. 09/916,682, filed Jul. 30, 2001, Ito.
U.S. Appl. No. 09/890,358, filed Jul. 30, 2001, Ito.
U.S. Appl. No. 09/917,749, filed Jul. 31, 2001, Ito.
U.S. Appl. No. 09/958,689, filed Oct. 10, 2001, Furukawa et al.
U.S. Appl. No. 09/979,676, filed Nov. 5, 2001, Zhou.
U.S. Appl. No. 10/048,894, filed Feb. 1, 2002, Furukawa.
U.S. Appl. No. 10/049,539, filed Nov. 7, 2001, Zhou.
U.S. Appl. No. 10/182,009, filed Jul. 24, 2002, Zhou.
U.S. Appl. No. 10/222,928, filed Aug. 19, 2002, Ito.
U.S. Appl. No. 10/265,413, filed Oct. 7, 2002, Ohashi et al.
U.S. Appl. No. 10/356,519, filed Feb. 3, 2003, Ito.
U.S. Appl. No. 10/217,029, filed Aug. 13, 2002, Ito.
U.S. Appl. No. 09/673,953, filed Dec. 21, 2000, Ito et al.
U.S. Appl. No. 09/524,010, filed Mar. 13, 2000, Niwa.
U.S. Appl. No. 09/946,463, filed Sep. 6, 2001, Niwa.
U.S. Appl. No. 10/244,008, filed Sep. 16, 2002, Niwa.
U.S. Appl. No. 09/806,477, filed Jun. 25, 2001, Ito et al.
U.S. Appl. No. 09/831,887, filed May 23, 2001, Ito et al.
U.S. Appl. No. 09/807,960, filed May 18, 2001, Hiramatsu et al.
U.S. Appl. No. 09/806,478, filed Jul. 26, 2001, Ito et al.
U.S. Appl. No. 09/869,321, filed Oct. 18, 2001, Zhou.
U.S. Appl. No. 09/926,012, filed Oct. 24, 2001, Hiramatsu et al.
U.S. Appl. No. 09/926,092, filed Dec. 21, 2001, Ito et al.
U.S. Appl. No. 09/926,297, filed Dec. 26, 2001, Hiramatsu et al.
U.S. Appl. No. 09/926,296, filed Dec. 27, 2001, Ito et al.
U.S. Appl. No. 09/926,362, filed Jan. 16, 2002, Hiramatsu et al.
U.S. Appl. No. 09/926,465, filed Feb. 12, 2002, Furukawa et al.
U.S. Appl. No. 09/926,464, filed Jan. 10, 2002, Hiramatsu et al.
U.S. Appl. No. 09/926,499, filed Mar. 26, 2002, Hiramatsu et al.
U.S. Appl. No. 09/926,714, filed Dec. 26, 2001, Ito et al.
U.S. Appl. No. 09/926,713, filed Mar. 5, 2002, Hiramatsu.
U.S. Appl. No. 10/009,174, filed Apr. 21, 2003, Hiramatsu et al.
U.S. Appl. No. 10/009,480, filed Mar. 27, 2002, Hiramatsu et al.
U.S. Appl. No. 10/019,448, filed Apr. 8, 2002, Ito et al.
U.S. Appl. No. 09/926,800, filed Mar. 19, 2002, Hiramatsu et al.
U.S. Appl. No. 10/019,444, filed Apr. 23, 2002, Hiramatsu et al.
U.S. Appl. No. 10/019,280, filed Apr. 22, 2002, Ito et al.
U.S. Appl. No. 10/019,311, filed Apr. 9, 2002, Hiramatsu et al.
U.S. Appl. No. 10/030,123, filed May 16, 2002, Hiramatsu et al.
U.S. Appl. No. 10/049,293, filed Apr. 30, 2002, Ito et al.
U.S. Appl. No. 10/069,943, filed Jul. 10, 2002, Ito et al.
U.S. Appl. No. 10/048,490, filed Apr. 30, 2002, Ito et al.
U.S. Appl. No. 10/048,979, filed Apr. 26, 2002, Hiramatsu et al.
U.S. Appl. No. 10/048,989, filed May 29, 2002, Hiramatsu et al.
U.S. Appl. No. 10/069,511, filed Jun. 24, 2002, Ito et al.
U.S. Appl. No. 10/069,510, filed Jun. 20, 2002, Hiramatsu et al.
U.S. Appl. No. 10/070,443, filed Jun. 24, 2002, Hiramatsu et al.
U.S. Appl. No. 10/070,441, filed Jun. 26, 2002, Ito et al.
U.S. Appl. No. 10/088,098, filed May 30, 2002, Ito et al.
U.S. Appl. No. 10/088,100, filed Jun. 26, 2002, Ito.
U.S. Appl. No. 10/118,967, filed Apr. 10, 2002, Ito et al.
U.S. Appl. No. 10/111,980, filed Apr. 30, 2002, Ito et al.
U.S. Appl. No. 10/168,527, filed Jun. 28, 2002, Hiramatsu et al.
U.S. Appl. No. 10/181,724, filed Jul. 22, 2002, Hiramatsu et al.
U.S. Appl. No. 10/226,160, filed Aug. 23, 2002, Ito et al.
U.S. Appl. No. 10/229,177, filed Aug. 28, 2002, Hiramatsu et al.
U.S. Appl. No. 10/277,818, filed Oct. 23, 2002, Hiramatsu et al.
U.S. Appl. No. 10/311,368, filed Dec. 16, 2002, Ito et al.
U.S. Appl. No. 10/352,138, filed Jan. 28, 2003, Hiramatsu et al.
U.S. Appl. No. 10/346,095, filed Jan. 17, 2003, Ito et al.
U.S. Appl. No. 10/343,747, filed Feb. 6, 2003, Ito et al.
U.S. Appl. No. 10/344,148, filed Feb. 10, 2003, Kariya et al.
U.S. Appl. No. 10/343,833, filed Feb. 10, 2003, Zhou et al.
U.S. Appl. No. 10/386,615, filed Mar. 13, 2003, Hiramatsu et al.
U.S. Appl. No. 10/387,452, filed Mar. 14, 2003, Ito et al.
U.S. Appl. No. 10/363,310, filed Mar. 3, 2003, Ito.
U.S. Appl. No. 10/397,321, filed Mar. 27, 2003, Hiramatsu et al.
U.S. Appl. No. 10/260,360, filed Oct. 1, 2002, Niwa.
U.S. Appl. No. 10/416,497, filed May 19, 2003, Hiramatsu et al.
U.S. Appl. No. 10/380,327, filed Mar. 13, 2003, Hiramatsu et al.

U.S. Appl. No. 10/746,081, filed Dec. 29, 2003, Hiramatsu et al.
U.S. Appl. No. 10/432,639, filed Nov. 6, 2003, Ito et al.
U.S. Appl. No. 10/624,589, filed Jul. 23, 2003, Furukawa et al.
U.S. Appl. No. 10/732,296, filed Dec. 11, 2003, Ito et al.
U.S. Appl. No. 10/755,308, filed Jan. 13, 2003, Hiramatsu et al.
U.S. Appl. No. 10/766,027, filed Jan. 29, 2004, Ito et al.
U.S. Appl. No. 10/759,083, filed Jan. 20, 2004, Hiramatsu et al.
U.S. Appl. No. 10/663,681, filed Sep. 17, 2003, Ito et al.
U.S. Appl. No. 10/618,655, filed Jul. 15, 2003, Ito et al.
U.S. Appl. No. 10/855,324, filed May 28, 2004, Ito et al.
U.S. Appl. No. 10/943,974, filed Sep. 20, 2004, Ito et al.
U.S. Appl. No. 10/918,351, filed Aug. 16, 2004, Ito et al.
U.S. Appl. No. 10/916,405, filed Aug. 12, 2004, Hiramatsu et al.
U.S. Appl. No. 10/921,992, filed Aug. 20, 2004, Hiramatsu et al.
U.S. Appl. No. 10/921,271, filed Aug. 19, 2004, Hiramatsu et al.
U.S. Appl. No. 10/969,945, filed Oct. 22, 2004, Ito et al.
U.S. Appl. No. 11/004,985, filed Dec. 7, 2004, Ito.
U.S. Appl. No. 10/876,665, filed Jun. 28, 2004, Ito et al.
U.S. Appl. No. 10/901,109, filed Jul. 29, 2004, Hiramatsu et al.
U.S. Appl. No. 10/900,113, filed Jul. 28, 2004, Hiramatsu et al.
U.S. Appl. No. 10/928,146, filed Aug. 30, 2004, Hiramatsu et al.

* cited by examiner (a)

(b)

(c)

(d)

(a)

(b)

CERAMIC SUBSTRATE FOR SEMICONDUCTOR MANUFACTURING, AND METHOD OF MANUFACTURING THE CERAMIC SUBSTRATE

TECHNICAL FIELD

The present invention relates to a ceramic substrate for a semiconductor-producing/examining device, which is used for a ceramic heater, an electrostatic chuck, a chuck top plate for a wafer prober, and the like mainly in the semiconductor industry.

BACKGROUND ART

Conventionally, a heater which employs a base material made of metal such as stainless steel or aluminum alloy has been used in semiconductor-producing/examining devices such as an etching device and a chemical vapor phase growth device.

However, such a heater made of metal has the following problems.

The thickness of its ceramic substrate must be as thick as on the order of 15 mm since the heater is made of metal. This is because, in a thin metal plate, a warp, a strain and the like are generated due to thermal expansion resulting from heating, so that a semiconductor wafer placed on the metal plate is damaged or inclined. However, if the thickness of the ceramic substrate is made thick, a problem that the heater becomes heavy and bulky arises.

Heating temperature is controlled by changing the voltage or current amount applied to heating elements. However, since the metal plate is large, the temperature of the ceramic substrate does not follow the change in the voltage or current amount promptly. Thus, a problem that the temperature is not easily controlled is caused.

The heater made of metal also has a problem that corrosion resistance against corrosive gas is poor since the heater is made of metal.

Dealing with the problems, JP Kokai Hei 11-40330 discloses a ceramic heater wherein a nitride ceramic or a carbide ceramic, which has a high thermal conductivity and a great strength, is used in place of the metal heater, and heating elements formed by sintering metal particles are provided on the surface of a ceramic substrate made of this ceramic.

In such a heater, a warp, a strain or the like is not easily generated in its ceramic substrate even if the heater thermally expands at the time of being heated. Thus, the temperature-following character thereof under a change in applied voltage or current amount is also good.

SUMMARY OF THE INVENTION

However, in a ceramic heater having such a configuration, its face for heating a semiconductor wafer or the like (hereinafter, referred to as a heating face) is constituted by a plane. If a semiconductor wafer is placed thereon, the entire face of the semiconductor wafer makes contact with the heating face. Therefore, when the semiconductor wafer is heated in this state, a temperature distribution in the surface of the ceramic substrate is reflected, as it is, on the semiconductor wafer. Thus, the semiconductor wafer or the like cannot be evenly heated so as to result in a problem that the semiconductor or the like is damaged by thermal impact.

Thus, the following method is adopted: a method of using lifter pins inserted into through holes or the like formed in the ceramic substrate, or using several supporting pins provided on the surface of the ceramic substrate, or the like, holding a semiconductor wafer or the like slightly apart from the ceramic substrate surface, and heating the wafer or the like. When this method is used, heat is conducted to the semiconductor wafer by radiation from the ceramic substrate and convection of atmospheric gas. Therefore, a temperature distribution in the ceramic substrate surface is not directly reflected on the semiconductor wafer so that an evener temperature distribution in the semiconductor wafer is realized.

However, when this method is used, a space is formed between the ceramic substrate and the semiconductor wafer. Since the periphery thereof is open, atmospheric gas present between the ceramic substrate and the semiconductor wafer easily escapes outward so that atmospheric gas having a low temperature comes to enter in place of the above-mentioned gas. For this reason, it cannot be said that the temperature evenness in the semiconductor wafer is sufficient. Moreover, because the atmospheric gas present between the ceramic substrate and the semiconductor wafer easily escapes, it cannot be said that the temperature-rising speed of the semiconductor wafer is sufficient.

Further, the semiconductor is distorted by the supporting pins so that the temperature evenness therein deteriorates.

With an increase in the diameter of semiconductor wafers or the like in recent years, a ceramic heater having a larger diameter has been demanded. However, as the diameter of the ceramic substrate becomes larger, a temperature distribution in the ceramic substrate itself is more easily generated. Thus, the above-mentioned unevenness of the temperature of the semiconductor wafer or the distortion of the semiconductor wafer is more and more easily generated.

In view of the above-mentioned problems, the present inventors made eager investigations to obtain a ceramic substrate (ceramic heater) in which it is possible to promptly raise its temperature, a heating face thereof has a small temperature variation, and no semiconductor wafer and the like is damaged or distorted by thermal impact. As a result, the present inventors have found out that by forming a number of convex bodies which make contact with a semiconductor wafer and the like on the heating face of a ceramic substrate, the temperature of the wafer and the like can be promptly raised and the temperature of the heating face can be made even, leading to achieve the present invention.

That is, a ceramic substrate for a semiconductor-producing/examining device according to a first aspect of the present invention is a ceramic substrate for a semiconductor-producing/examining device having a resistance heating element formed on a surface thereof or inside thereof, wherein a projected portion for fitting a semiconductor wafer is formed along the periphery thereof and a large number of convex bodies, which make contact with the semiconductor wafer, are formed inside the projected portion.

According to the ceramic substrate for a semiconductor-producing/examining device of the first aspect of the present invention, an object to be heated, such as a semiconductor wafer, does not make contact with the entire surface of the ceramic substrate. Therefore, a temperature distribution in the ceramic substrate surface is not reflected, as it is, on the ceramic substrate wafer. Moreover, heat is also conducted by convection of atmospheric gas or radiation. Therefore, the temperature of the semiconductor wafer can be made even.

In addition, according to the ceramic substrate for a semiconductor-producing/examining device of the first aspect of the present invention, a projected portion for fitting a semiconductor wafer is formed. Therefore, heat from the ceramic substrate can be conducted to the semiconductor wafer by radiation from the ceramic substrate or convection of atmospheric gas without causing heat to escape. Thus, the temperature of the ceramic substrate can be promptly raised.

Since the wafer is fitted to the projected portion in the periphery of the ceramic substrate, it does not happen that the side face of the wafer periphery makes contact with the atmospheric gas or heat is radiated from the wafer periphery. Therefore, the temperature of the periphery of the wafer does not drop. Since the temperature of the periphery of the ceramic substrate becomes low, it is preferable that the wafer does not make contact with the periphery of the ceramic substrate. Since the wafer is present inside the peripheral projected portion in the present invention, the wafer does not make contact with any low temperature portion of the ceramic substrate.

Incidentally, JP Kokai No. 2000-106392 discloses an electrostatic chuck having embossment and peripheral convex bodies. However, since the peripheral convex portion makes contact with a wafer, the wafer makes contact with atmospheric gas or heat is radiated from the wafer. Thus, the peripheral temperature of the wafer drops. As a result, the effect of the present invention cannot be realized.

Since the convex bodies in large numbers make contact with the semiconductor wafer at the same level, the ceramic substrate neither warps nor undulates. Thus, unevenness of the temperature, breakdown and the like, resulting from the warp and the like, do not occur.

Since the peripheral projected portion is fitted to the wafer, the projected portion is higher than numbers of convex bodies. That is, upper face of the peripheral projected portion is at a position higher than upper face of the convex body. The difference in height between upper face of the peripheral projected portion and upper face of the convex body is desirably from 10 $\mu$m to 5000 $\mu$m. This is because if the difference is too large or too small, the temperature distribution in the wafer becomes large.

In the ceramic substrate for a semiconductor-producing/examining device of the first aspect of the present invention, upper part of the convex body is desirably constituted by a plane. This is because by supporting a semiconductor wafer by a portion in a plane shape, thermal conductivity becomes good and it is also possible to prevent the surface of the semiconductor wafer from being damaged.

An object wherein the temperature evenness is further improved from that of the first aspect of the present invention as described above is a second aspect of the present invention. In the first aspect of the present invention, the convex bodies and the peripheral projected portion are formed by a method such as drilling or chemical etching.

When the surface roughness of upper part of the convex body is equal to that of the non convex body formed face, upper part surface of the convex body does not make contact with a wafer sufficiently in case the surface roughness is too large while in case the surface roughness is too small, atmospheric gas flows. Thus, it has been found that both of the cases hinder an improvement in the evenness of the temperature of the wafer.

It is considered that, as the surface roughness of the non convex body formed portion becomes larger, it is more necessary that adhesiveness between the wafer and the convex body is improved. This is based on the following reason: as the surface roughness of the non convex body formed portion becomes larger, the fluidity of the heated gas is more suppressed. In the meanwhile it is necessary to prevent this heated gas from flowing out from a gap between the wafer and upper face of the convex body.

The second aspect of the present invention succeeded in: ensuring a contact area between upper face of the convex body and the wafer by adjusting the surface roughness of the non convex body formed portion larger than that of upper face of the convex body; and suppressing the fluidity of air by setting the Rmax, not the Ra, of non convex body formed portion to 1 to 100 $\mu$m.

That is, the ceramic substrate for a semiconductor-producing/examining device according to the second aspect of the present invention is a ceramic substrate for a semiconductor-producing/examining device having a resistance heating element formed on a surface thereof or inside thereof, wherein a large number of convex bodies, which make contact with a semiconductor wafer, are formed on a heating face thereof, upper part of the convex body is constituted by a plane, and the surface roughness Rmax, according to JIS B 0601, of a non convex body formed portion is from 1 to 100 $\mu$m, and is larger than the surface roughness Rmax of upper part of the convex body.

The Rmax means a height difference obtained by subtracting the height of the lowest position (valley) from that of the highest position (mountain), the heights being measured from arbitrary mean line.

On the other hand, Ra is a value obtained by integrating the absolute value of a sectional curve of a roughened face and then dividing the resultant value by a measured length, and is an average value of the heights of the irregularities. Even if the average roughness is adjusted, the contact between the roughened face and a wafer becomes a point contact when large undulations exist locally. Thus, the wafer and the convex bodies do not make contact with each other sufficiently. By making the surface roughness large, atmospheric gas is caused to remain. However, it has been found out that if large undulations exist locally, heat is accumulated so much that the temperature in the heating face becomes uneven. Accordingly, it becomes necessary to adjust not the Ra but the Rmax. The Ra and the Rmax have no correlation, and there may be a case where the Ra is 0.1 $\mu$m while the Rmax is 10 $\mu$m. The average value of the heights and the height difference are entirely different in technical meaning.

Using the ceramic substrate for a semiconductor-producing/examining device of the second aspect of the present invention, an object to be heated, such as a semiconductor wafer, does not make contact with the entire surface of the ceramic substrate. Therefore, a temperature distribution in the ceramic substrate surface is not reflected as it is on the object to be heated. Moreover, heat is conducted by convection of atmospheric gas, radiation and the like. Therefore, the temperature of the semiconductor wafer can be made even.

Since the surface roughness Rmax, according to JIS B 0601, of the non convex body formed portion is adjusted to 1 to 100 $\mu$m, heated atmospheric gas can be caused to remain without local accumulation of heat by the roughened face formed in the non convex body formed portion. Therefore, the ceramic substrate has a superior heat-accumulating effect so that the ceramic substrate not only has the above-mentioned effect but also makes it possible to heat an object to be heated, such as a semiconductor wafer, promptly. If the Rmax is less than 1 μm, the atmospheric gas is not caused to remain. If the Rmax is more than 100 μm, heat is accumulated too much so that the temperature of the heating face becomes uneven.

Since the surface roughness Rmax of upper part of the convex body is adjusted to a value smaller than the surface roughness of the non convex body formed portion, the contact area between upper part of the convex body, which is a smooth plane, and a semiconductor wafer becomes large. As a result, heat from the ceramic substrate is effectively conducted to the semiconductor wafer. Thus, the object to be heated, the semiconductor wafer for example, can be promptly heated.

As described above, in the ceramic substrate for a semiconductor-producing/examining device of the second aspect of the present invention, the roughened face having a high heat-accumulating effect is formed in the non convex body formed portion which does not make contact with a semiconductor wafer, and a smooth plane is formed on upper part of the convex body which makes contact with the semiconductor wafer in order to increase the contact area with the semiconductor wafer. Therefore, the object to be heated, such as a semiconductor wafer, can be promptly heated while the temperature of the semiconductor wafer can be made even.

In the ceramic substrate for a semiconductor-producing/examining device of the second aspect of present invention, a projected portion for fitting a semiconductor wafer may be formed in its periphery in the same manner as in the ceramic substrate for a semiconductor-producing/examining device of the first aspect of the present invention.

In the ceramic substrate for a semiconductor-producing/examining device of the second aspect of the present invention, the surface roughness Rmax, according to JIS B 0601, of upper part of the convex body, is desirably from 0.03 to 10 μm. By forming the above-mentioned smooth plane on upper part of the convex body, the contact area between an object to be heated, such as a semiconductor wafer, and the convex body can be made large. As a result, the temperature of the object to be heated, such as a semiconductor wafer, can be made even while the object to be heated can be promptly heated.

Furthermore, in the second aspect of the present invention, by adjusting the surface roughness, the evenness in the in-plane temperature is ensured. Therefore, the peripheral projected portion is not necessarily needed.

In the ceramic substrates of the first and second aspects of the present invention, a plurality of through holes are desirably provided in the non convex body formed portion. This is based on the following reason: by causing a heating medium or a cooling medium to flow through this through hole to heat or cool a semiconductor wafer and the like, the temperature thereof can be more promptly raised or lowered. In the ceramic substrate for a semiconductor-producing/examining device of the first aspect of the present invention, the projected portion for fitting a semiconductor wafer is formed. Therefore, by performing suction through this through hole, the ceramic substrate can have a chuck function.

A method for manufacturing a ceramic substrate for a semiconductor-producing/examining device of the present invention is a method for manufacturing a ceramic substrate for a semiconductor-producing/examining device having: a resistance heating element formed on a surface thereof or inside thereof; and a large number of convex bodies, which make contact with a semiconductor wafer, formed on a heating face thereof, upper part of the convex body being constituted by a plane, wherein:

the method comprising at least the following steps (a) to (c):

(a) a ceramic substrate producing step of producing a ceramic substrate in which: the plurality of convex bodies are formed on the heating face; and a resistance heating element is formed on a surface thereof or inside thereof;

(b) a roughened face forming step of forming roughened face on upper part of the convex body and on a non convex body formed portion, which are the heating face of the ceramic substrate, by a physical and/or chemical method so as to set the surface roughness Rmax, according to JIS B 0601, of the non convex body formed portion to 1 to 100 μm; and (c) a smoothening step of subjecting upper part of the convex body to smoothing treatment so as to make the surface roughness Rmax of upper part of the convex body smaller than the surface roughness Rmax of the non convex body formed portion.

According to the method for manufacturing a ceramic substrate for a semiconductor-producing/examining device of the present invention, it is possible to obtain the ceramic substrate for a semiconductor-producing/examining device of the second aspect of the present invention capable of heating an object to be heated, such as a semiconductor wafer, promptly and making the temperature of the semiconductor wafer even as described above.

According to the method for manufacturing a ceramic substrate for a semiconductor-producing/examining device of the present invention, it becomes easily possible to make the surface roughness of upper face of the convex body smaller than that of upper face of the non convex body formed portion since the roughened face is formed in the whole of the heating face of the ceramic substrate and subsequently upper part of the convex body is subjected to the smoothing treatment to form a smooth face.

Incidentally, in JP Kokai No. 2000-106392, convex bodies or embossments are formed by blast treatment or CVD treatment. In the former method, however, the surface roughness of upper face of the convex body becomes equal to that of upper face of the non convex body formed portion. In the latter method, the surface roughness of the ceramic precipitated by CVD becomes as large as 1000 μm or more as Rmax. In both cases, therefore, it is impossible to make the surface roughness of upper face of the convex body smaller than that of upper face of the non convex body formed portion as attained in the present invention.

In the case where the blast treatment is carried out, a mask is formed in a portion not to be removed by the blast treatment. In this process, a phenomenon that a portion under the mask is hollowed out, called undercut, occurs. It is therefore necessary to adopt a procedure of removing the mask and subjecting the whole surface to blast treatment to remove the undercut. By performing this treatment, however, the whole surface is evenly roughened so that the configuration of "making the surface roughness of upper face of the convex body smaller than that of upper face of the non convex body formed portion" cannot be realized.

Figure 1:
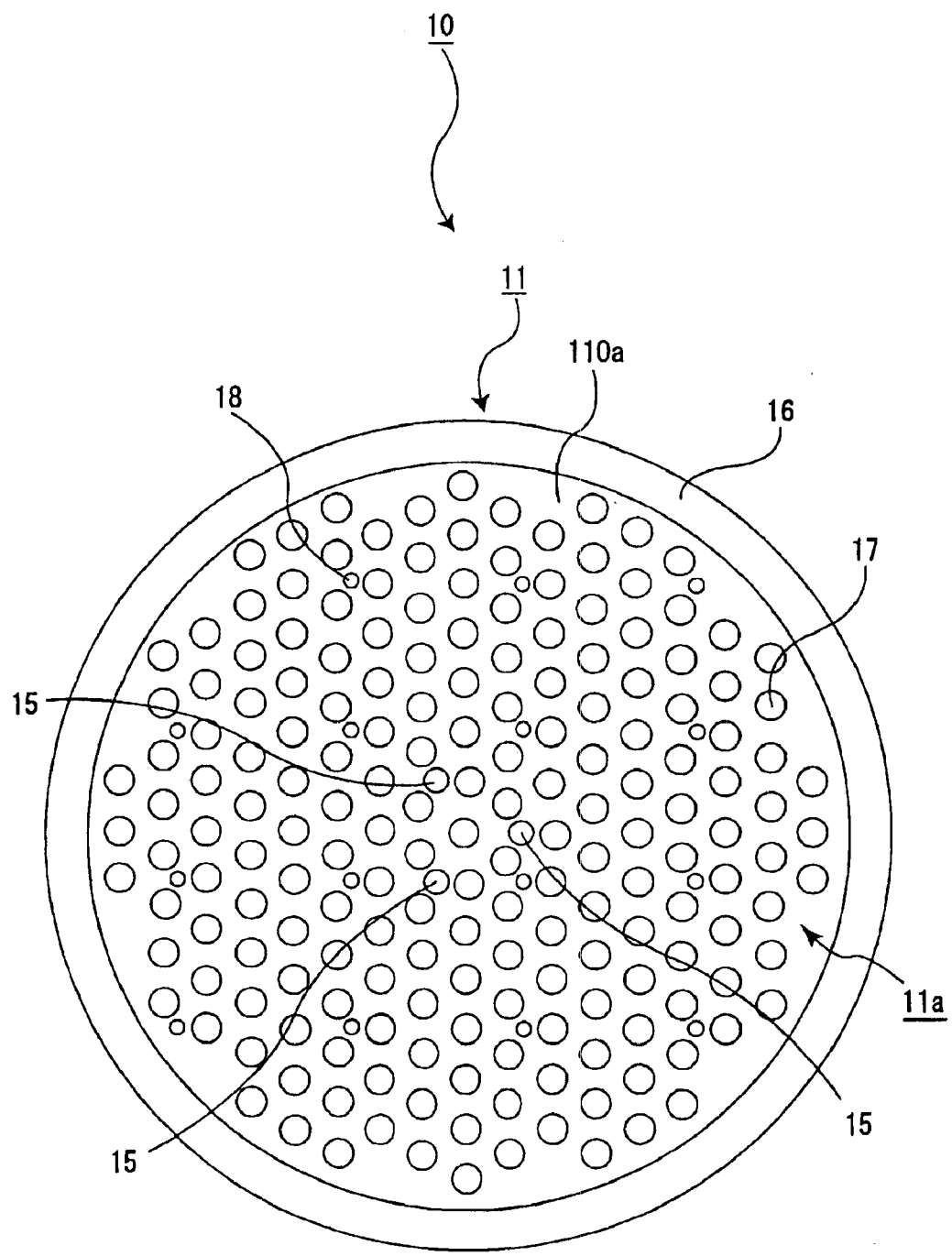
FIG. 1 is a plan view which schematically shows an example of a ceramic heater according to the first aspect of the present invention.

EXPLANATION OF NUMERALS 10, 20, 80 ceramic heater
11, 21, 41, 81 ceramic substrate
11a, 21a, 81a heating face
11b, 21b bottom face
110a, 210a, 810a non convex body formed portion
12, 22, 45, 82 resistance heating element
120 conductor containing paste
13, 23, 83 external terminal
14, 24, 84 bottomed hole
15, 25, 85 through hole for a lifter pin
16, 26, 46 projected portion
17 (170 to 173), 27, 47, 87 convex body
18, 28, 48, 88 through hole for ventilation
19 conductor-filled through hole
26a groove
190 filling layer
19a blind hole
220, 820 metal covering layer
36 lifter pin
39 semiconductor wafer
40, 60, 70 electrostatic chuck
42, 62, 72 chuck positive electrostatic layer
43, 63, 73 chuck negative electrostatic layer
44 chuck dielectric layer
50 green sheet

DETAILED DISCLOSURE OF THE INVENTION

The ceramic substrate for a semiconductor-producing/examining device of the first aspect of the present invention is a ceramic substrate for a semiconductor-producing/examining device having a resistance heating element formed on a surface thereof or inside thereof, wherein a projected portion for fitting a semiconductor wafer is formed along the periphery thereof and a large number of convex bodies, which make contact with the semiconductor wafer, are formed inside the projected portion. In the following description, a ceramic substrate for a semiconductor-producing/examining device is referred to simply as a ceramic substrate as well.

The ceramic substrate of the first aspect of the present invention can be used as a ceramic heater in the case in which only resistance heating elements are formed therein.

Thus, a case in which the ceramic substrate of the first aspect of the present invention is used as a ceramic heater will first be described.

Figure 2:
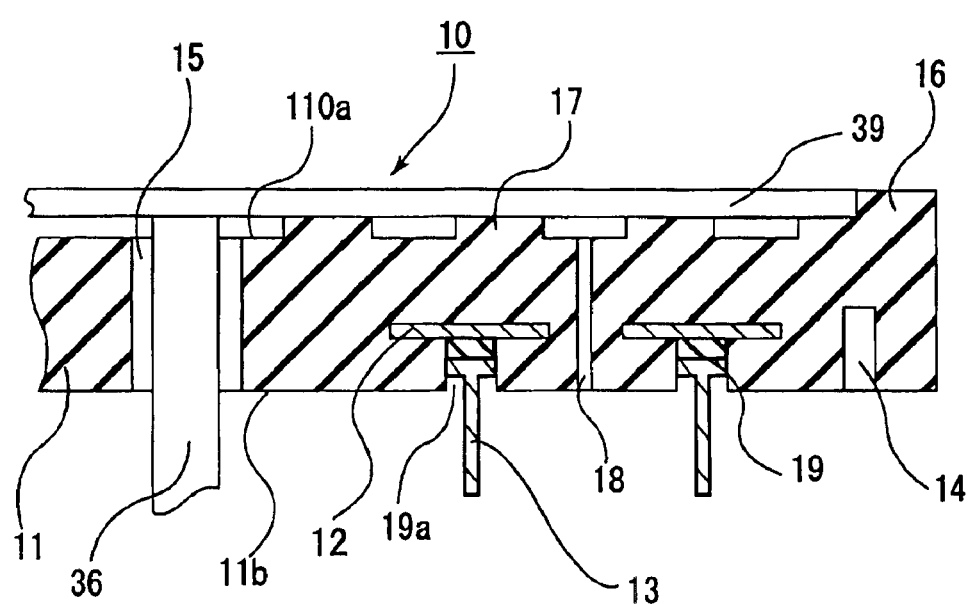
FIG. 2 is a partially enlarged sectional view of the ceramic heater shown in FIG. 1.
Figure 3:
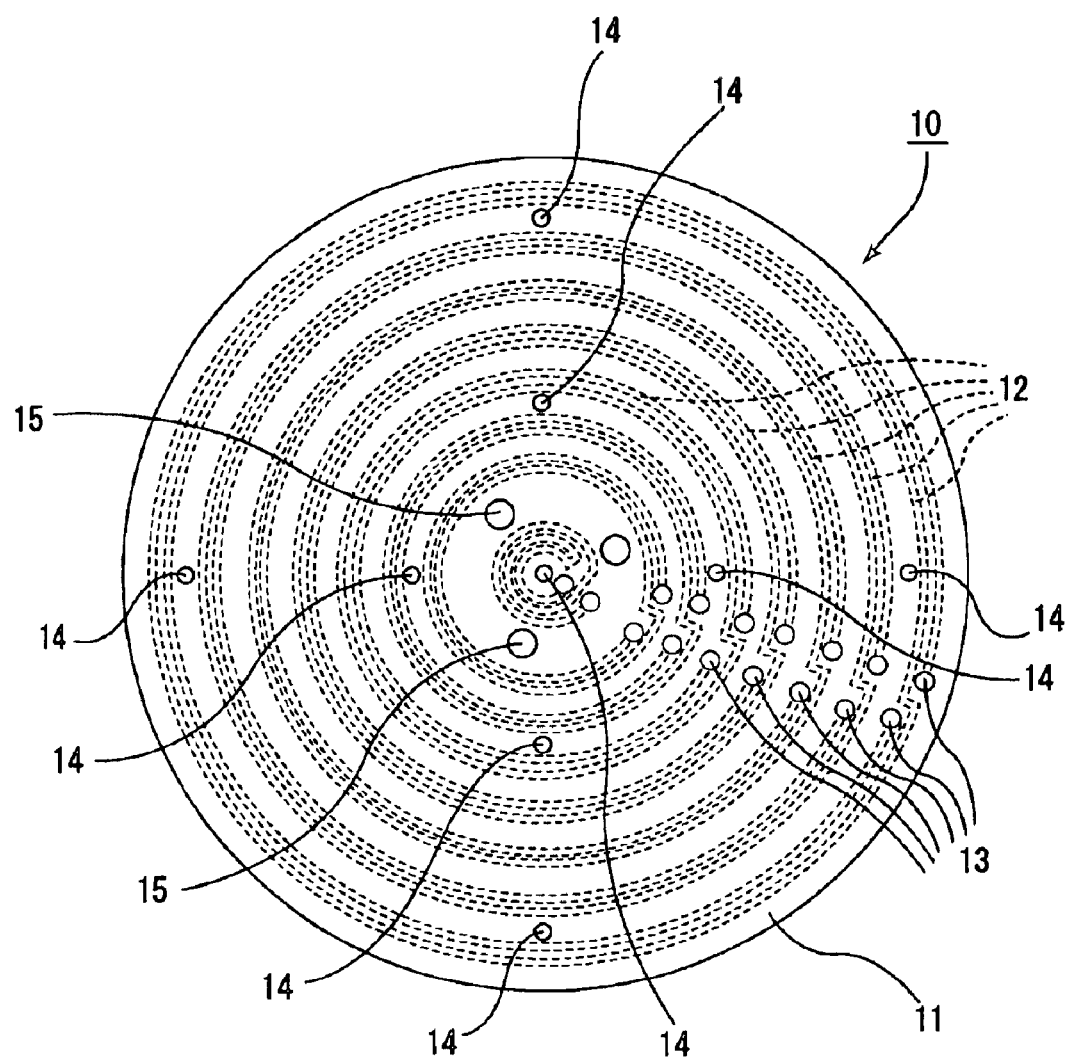
FIG. 3 is a bottom view of the ceramic heater shown in FIG. 1.

FIG. 1 is a plan view which schematically illustrates an example of a heating face of a ceramic heater according to the first aspect of the present invention. FIG. 2 is a sectional view which schematically illustrates a portion of the ceramic heater illustrated in FIG. 1. FIG. 3 is a bottom view which schematically illustrates the ceramic heater illustrated in FIG. 1. In this ceramic heater, resistance heating elements are formed inside a ceramic substrate.

As illustrated in FIG. 1, a ceramic substrate 11 is made in a disc form, and an annular projected portion 16 for fitting a semiconductor wafer is formed to be integrated with the periphery of a heating face 11a of the ceramic substrate. Inside the projected portion 16, a large number of convex bodies 17 which contact the above-mentioned semiconductor wafer are formed.

On a non convex body formed portion 110a, where the convex bodies 17 are not formed, plural through holes 18 for ventilation reaching a bottom face 11b are formed. The through holes 18 for ventilation can be used, for example, for the supply of a heating medium or a cooling medium, as described later. Besides, the holes can be used for suction or adsorption of the semiconductor wafer and the like. However, the holes are not essential for the first aspect of the present invention.

In order to perform heating in such a manner that the temperature of the whole of the heating face 11a of the ceramic heater 10 will be even, resistance heating elements 12 in a concentric circle pattern are formed inside the ceramic substrate 11, as illustrated in FIG. 3.

Conductor-filled through holes 19 are made just under the end portions of the resistance heating element 12. Blind holes 19a for exposing the conductor-filled through holes 19 are formed in a bottom face 11b. An external terminal 13 is inserted into the blind hole 19a, and they are jointed with a brazing material (not illustrated) and the like. A socket (not illustrated), for example, having a conductive wire is fitted to the external terminal 13, and this conductive wire is connected to a power source and the like.

Through holes 15 for lifter pins for letting lifter pins 36 for carrying a semiconductor wafer 39 pass through are made near the center of the ceramic substrate 11. Furthermore, bottomed holes 14, into which temperature measuring elements (not illustrated) will be inserted, are formed.

Figure 4:
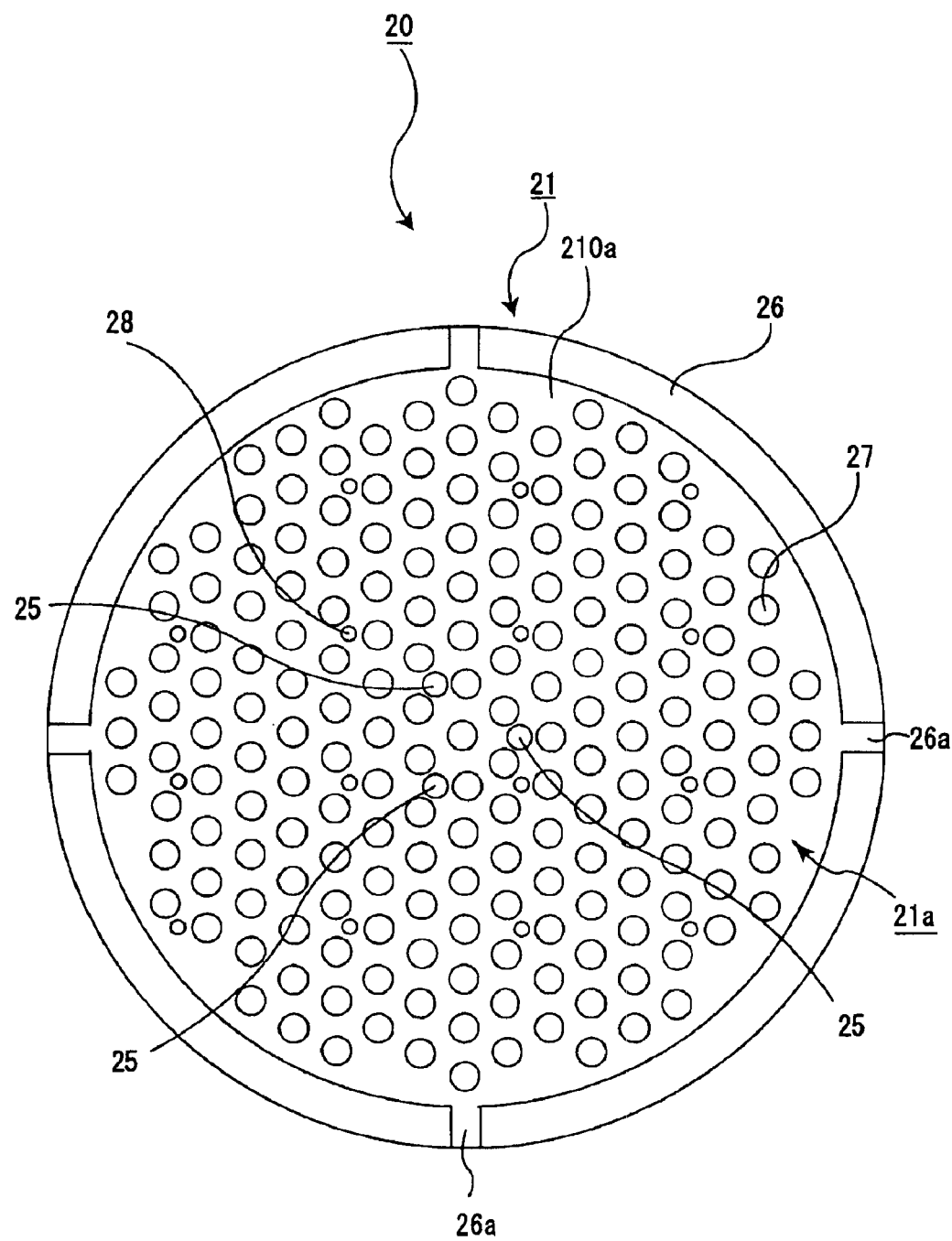
FIG. 4 is a plan view which schematically shows another example of a ceramic heater according to the first aspect of the present invention.
Figure 5:
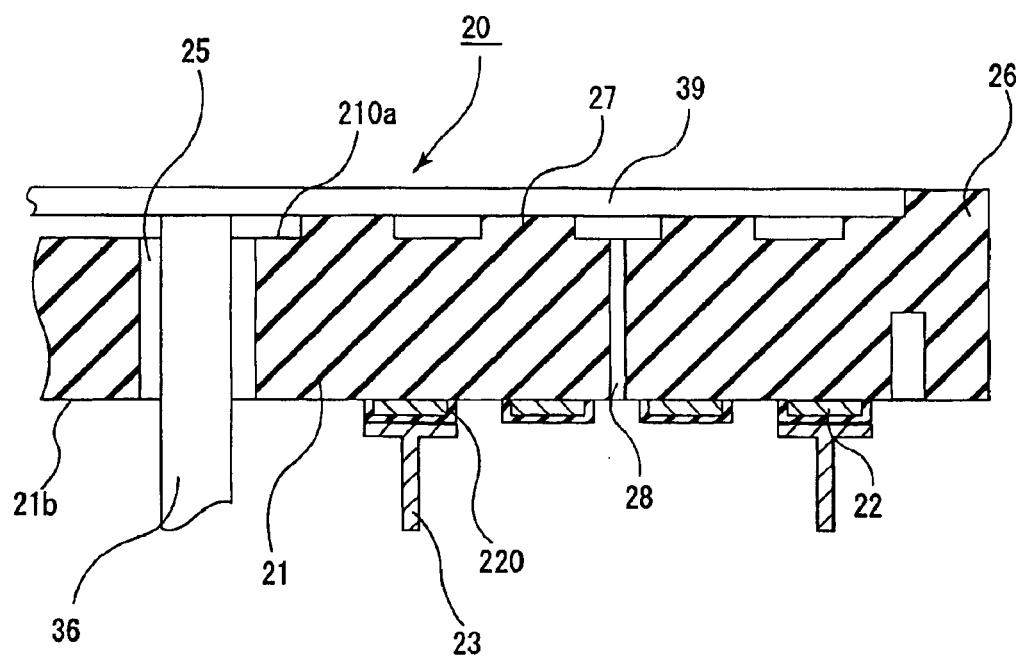
FIG. 5 is a partially enlarged sectional view of the ceramic heater shown in FIG. 4.
Figure 6:
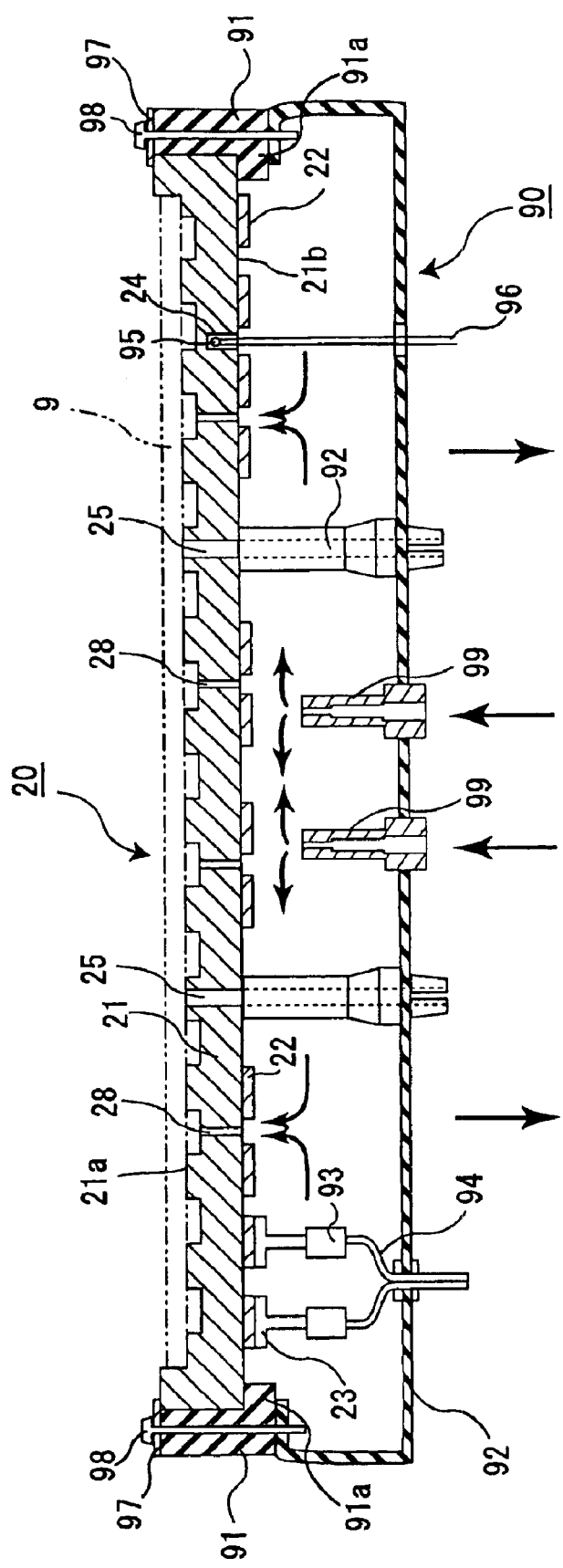
FIG. 6 is a sectional view showing a case where the ceramic heater shown in FIG. 4 is installed in a supporting case.

FIG. 4 is a plan view which schematically illustrates one example of a heating face of a ceramic heater having, on the surface thereof, resistance heating elements, which is another example of the first aspect of the present invention. FIG. 5 is a partially-enlarged sectional view of a portion of the ceramic heater illustrated in FIG. 4. FIG. 6 is a sectional view which schematically illustrates a hot plate unit having the ceramic heater illustrated in FIGS. 4 and 5.

In this ceramic heater 20, resistance heating elements 22 in a concentric circle pattern having the same shape as the pattern illustrated in FIG. 3 are formed on the bottom face of a ceramic substrate 21 made into a disc form. To both ends thereof are connected external terminals 23, which become terminals for input and output, through a metal covering layer 220.

An annular projected portion 26, for fitting a semiconductor wafer, is formed along the periphery of a heating face 21a of the ceramic substrate 21. A great number of convex bodies 27, which contact the above-mentioned semiconductor wafer, are formed inside the projected portion 26. Plural through holes 28 for ventilation are formed on a non convex body formed portion 210a, where the convex bodies 27 are not formed.

However, this ceramic heater is different from the ceramic heater 10 illustrated in FIGS. 1 to 3 in that grooves 26a for causing a heating medium or a cooling medium to escape are formed at 4 positions of the projected portion 26 of this ceramic substrate 21.

On the other hand, a substrate receiving portion 91a for supporting the ceramic substrate 21 having the resistance heating elements 22 is integrated with the lower inside of a heat-insulating member 91 fitted to upper portion of a supporting case 90. A supporting case body 92 having the shape of bottomed cylinder is fitted and fixed to the lower face of the heat-insulating member 91 with bolts 98.

The bolts 98 also have a function of fixing a metal member 97 for pressing. By the metal member 97 for pressing, the ceramic substrate 21 fitted into the heat-insulating member 91 is pressed against the substrate-receiving section 21a and fixed.

A gas-introducing pipe 99 is fitted to the bottom of the supporting case body 92, and a heating medium or a cooling medium is introduced to the inside of the supporting case 90 through this gas-introducing pipe 99.

The heating medium or the cooling medium introduced to the inside of the supporting case 90 cools or heats the ceramic substrate 21, and further reaches the space of the non convex body formed portion 210a through the through holes 28 for ventilation so as to directly heat or cool a silicon wafer 9 put on the ceramic substrate 21. The medium is then discharged outside through the grooves 26a formed in the projected portion 26.

In the ceramic heater illustrated in FIGS. 4 and 5, by making the grooves 26a in the projected portion 26, the heating medium or the cooling medium is introduced to the space of the non convex body formed portion 210a and is then discharged through the grooves 26a. However, the silicon wafer and the like may be directly cooled or heated by discharging the heating medium or the cooling medium, which is introduced from one of the through holes 28 for ventilation to the space of the non convex body formed portion 210a, from the other through holes 28 for ventilation.

In this case, the tips of the gas-introducing pipes 99 are caused to contact the through holes 28 for ventilation, and the heating medium or the cooling medium should be blown directly from the gas-introducing pipes 99 to the through holes 28 for ventilation. At this time, through holes are formed in the supporting case body 92, and the heating medium or the cooling medium is discharged.

As illustrated in FIG. 1, in the ceramic heater according to the first aspect of the present invention, the projected portion, which is annular when viewed from the above, is formed along the periphery of the ceramic substrate. This projected portion is desirably formed in such a manner that the diameter of the inner circumference thereof is substantially equal to that of the diameter of the semiconductor wafer. This is because the semiconductor wafer and the like are fitted thereto and heat conducted to the semiconductor wafer and the like by radiation from the ceramic substrate and convection of atmospheric gas is not caused to escape. However, no problem arises even if the diameter of the above-mentioned inner circumference of the projected portion is slightly larger than the diameter of the semiconductor wafer. This is based on the following reason: if a plane portion which is annular when viewed from the above and as high as the convex bodies is formed inside the projected portion, it is possible to prevent the heating medium or the cooling medium from leaking from the vicinity of the semiconductor wafer. The above-mentioned projected portion does not have to be a continuous ring but may be a discontinuous ring, as illustrated in FIG. 4.

The above-mentioned projected portion is usually constituted to have a rectangular vertical section. However, in order to perform the fitting of the semiconductor wafer and the like easily, the inner circumferential side of upper part thereof may be formed to be curved. The projected portion may be formed to have a partial-ellipse vertical section, or a partial-circle vertical section.

The thickness of the above-mentioned projected portion is desirably 0.3 mm or more, in order to fit and fix the semiconductor wafer to the projected portion.

If the thickness of the projected portion is less than 0.3 mm, it is difficult to fix the semiconductor wafer to the ceramic substrate firmly when the semiconductor wafer is placed on the ceramic substrate. Thus, it is apprehended that the position of the semiconductor wafer and the like may move in the middle of heating and the like.

The convex bodies 17 are all formed to have the same height from the non convex body formed portion. This is because by bringing all of the convex bodies into contact with the semiconductor wafer, heat can be evenly conducted from the ceramic substrate to the semiconductor wafer. On the other hand, when the heights of the convex bodies 17 are uneven, spots where the ceramic substrate contacts the semiconductor wafer are scattered or unevenly distributed. Therefore, in the semiconductor wafer, peculiar points (hot spots, which are contact spots having a high temperature or cooling spots, which are contact spots having a low temperature) are generated.

It is desired that all of the convex bodies 17 have the same shape and are orderly arranged at equal intervals. This is because heat can be evenly conducted from the ceramic substrate to the semiconductor wafer.

Figure 7:
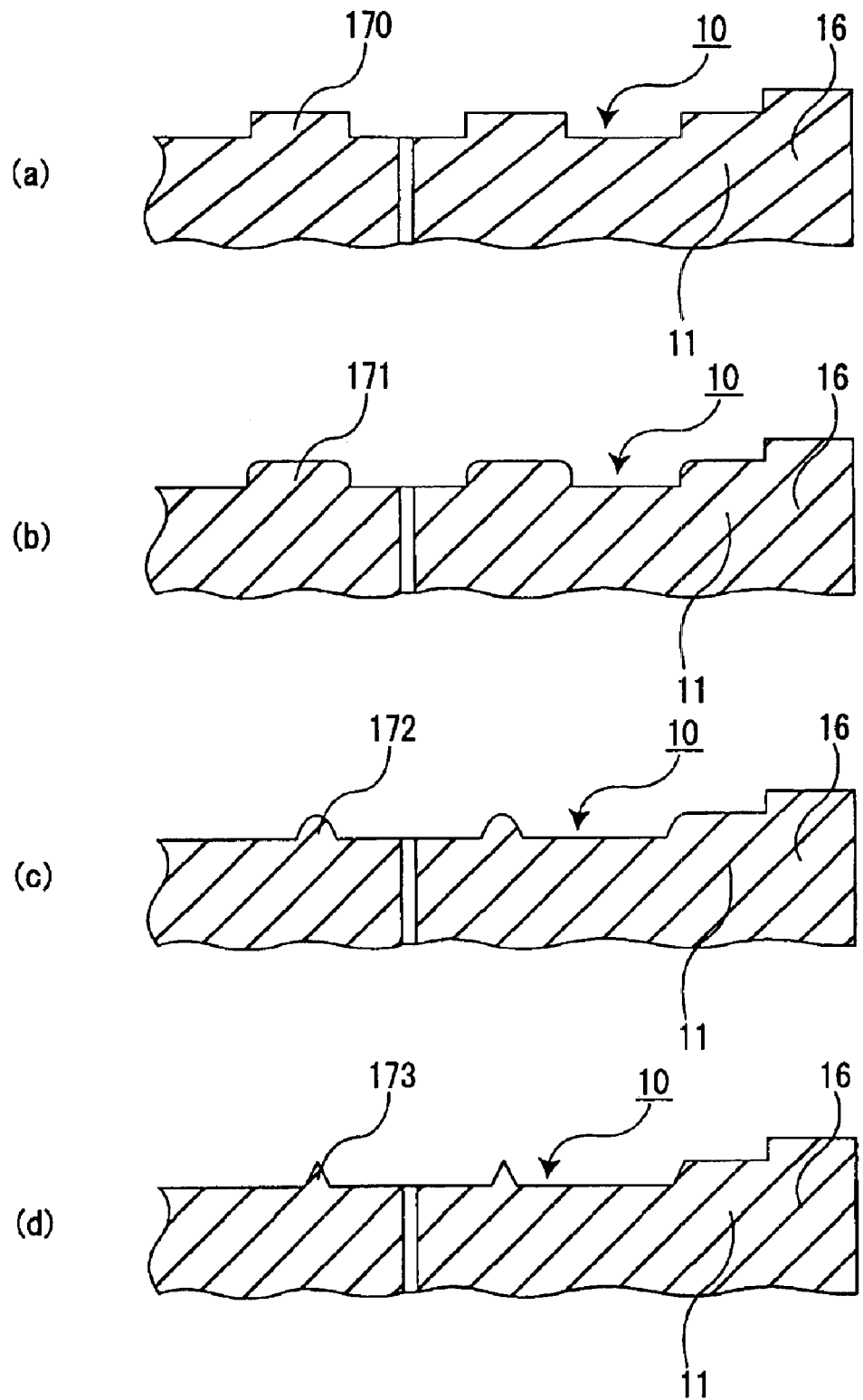
FIGS. 7(a) to 7(d) are sectional views which schematically show convex body formed in a ceramic heater according to the present invention.

FIG. 7 is partially-enlarged sectional views which schematically illustrate convex bodies formed in the ceramic heater according to the first aspect of the present invention. A convex body 170 illustrated in FIG. 7(a) is columnar and upper part thereof is constituted by a plane. A convex body 171 illustrated in FIG. 7(b) is substantially columnar and a curved face is formed between upper face and the side face. A convex body 172 illustrated in FIG. 7(c) is semispherical, and a convex body 173 illustrated in FIG. 7(d) is conical.

Regarding the convex body formed in the above-mentioned ceramic heater, upper part thereof is desirably constituted by a plane, as illustrated by the convex bodies 170 and 171. This is because the convex bodies face-contact the semiconductor wafer so that heat is easily conducted from the ceramic substrate to the semiconductor wafer, and the semiconductor wafer is not easily damaged. However, the shape of the convex body is not particularly limited. The shape may be semispherical or conical, as illustrated by convex bodies 172 and 173, so that the convex bodies point-contact the semiconductor wafer.

The heights of the convex bodies in large numbers formed inside the projected portion 16 (the depths of the non convex body formed portion) are desirably from 5 to 5000 $\mu$m, more desirably from 5 to 500 $\mu$m. If the heights of the convex bodies are less than 5 $\mu$m, the distance between the non convex body formed portion and the semiconductor wafer is too short so that the temperature distribution in the ceramic substrate is easily reflected directly on the semiconductor wafer. On the other hand, if the heights of the convex bodies are more than 5000 $\mu$m, the depths of the non convex body formed portion are too large so that much time is required for working operation and working costs also increase.

The respective convex bodies are desirably formed in such a manner that the distances between the centers of the convex bodies are from 0.6 to 12 mm. If the distances between the centers are less than 0.6 mm, the contact area between the semiconductor wafer and the ceramic substrate is so large that the temperature distribution in the ceramic substrate is easily reflected on the temperature distribution in the semiconductor wafer. On the other hand, if the distances between the centers are more than 12 mm, force acting on one of the convex bodies becomes large when force acts on the settled semiconductor wafer. As a result, the semiconductor wafer tends to get warped, damaged and the like.

The contact area between each of the convex bodies and the semiconductor wafer is desirably 314 mm$^2$ or less. If the contact area is more than 314 mm$^2$, it is apprehended that temperature varies in the contact area between each of the convex bodies and the semiconductor wafer.

Regarding the arrangement of the convex bodies, the existence densities of the convex bodies at the central portion of the ceramic substrate and at the peripheral portion thereof maybe different. An example of the arrangement is an arrangement wherein the convex bodies are arranged sparsely in the central portion and densely in the peripheral portion.

The percentage of the ratio of the area where the convex bodies 17 contact the semiconductor wafer 39 to the area of the semiconductor wafer 39 fitted to the projected portion 16 of the ceramic heater according to the first aspect of the present invention, represented by S (%), is, desirably, $0.05\% \leq S \leq 95\%$.

Heat conducted from the ceramic substrate to the semiconductor wafer through the convex bodies is directly and promptly conducted since the ceramic substrate contacts the semiconductor wafer. However, a variation in temperature in the heating face is reflected, as it is, thereon. Thus, a variation in temperature in the semiconductor wafer tends to generate. On the other hand, heat conducted to the semiconductor wafer and the like by radiation from the ceramic substrate and by convection of atmospheric gas is conducted through a space, or a fluid, such as the atmospheric gas. Therefore, the heat is easily averaged and the temperature of the semiconductor wafer tends to be made even.

Namely, if S is within the above-mentioned range, heat conducted from the ceramic substrate to the semiconductor wafer through the convex bodies counterbalances with heat conducted to the semiconductor wafer and the like by radiation from the ceramic substrate and convection of atmospheric gas, so that the semiconductor wafer and the like can be promptly heated and the temperature in the heating face becomes even.

If S is less than 0.05%, the contact area between the convex bodies and the semiconductor wafer is small. Therefore, heat conducted from the ceramic substrate to the semiconductor wafer and the like decreases so that the semiconductor wafer and the like cannot be promptly heated.

If S is more than 95%, the contact area between the convex bodies and the semiconductor wafer is large. Therefore, the temperature in the heating face is not easily made even.

As described above, in the ceramic heater according to the first aspect of the present invention, the projected portion, for fitting the semiconductor wafer, is formed along the periphery of the ceramic substrate and the convex bodies in large numbers which contact the semiconductor wafer are formed inside the projected portion; therefore, a temperature distribution in the surface of the ceramic substrate is not reflected on the semiconductor wafer and the temperature of the heating face can be made even. Moreover, heat conducted by radiation from the ceramic substrate and convection of the atmospheric gas can be conducted to the semiconductor wafer without causing the heat to escape; therefore, it is possible to raise the temperature of the ceramic heater promptly.

It is desirable that plural through holes 18 for ventilation are formed in the non convex body formed portion 110a in the ceramic substrate 11. This is because the temperature can be promptly raised by supplying a heating medium such as hot air.

It is desirable that all of the through holes 18 for ventilation have the same shape and are orderly arranged at equal intervals. This is because the semiconductor wafer can be heated to an even temperature when the heating medium such as hot air is supplied. As illustrated in FIG. 1, the through holes 18 for ventilation are desirably formed at positions apart from the adjacent convex bodies 17 at equal intervals. This is because the heating medium such as hot air diffuses smoothly.

The number of the through holes 18 for ventilation is preferably from 1 to 500 per 100 mm$^2$. If the number is smaller than 1 per 100 mm$^2$, it is difficult to supply the heating medium such as hot air sufficiently. If the number is larger than 500 per 100 mm$^2$, the strength of the ceramic substrate becomes poor.

The diameters of the through holes 18 for ventilation are desirably from 0.5 to 15 mm. If the diameters are less than 0.5 mm, pressure loss at the time of supplying the heating medium and the like becomes large so that the heating medium cannot be smoothly supplied. If the diameters are more than 15 mm, the strength of the ceramic substrate becomes poor.

The heating medium supplied from the through holes for ventilation is desirably hot air obtained by heating gas since the hot air does not pollute the semiconductor wafer. Examples of the gas include inert gases such as nitrogen, argon, helium and CFC, and air and the like.

As described above, by forming the through holes for ventilation, supplying the heating medium such as hot air, and circulating the medium forcibly, the temperature of the semiconductor wafer can be made evener and can be more rapidly raised. By supplying a cooling medium from the through holes for ventilation, the temperature of the semiconductor wafer can be rapidly lowered. It is also possible to suck the semiconductor wafer through the through holes for ventilation so as to adsorb and fix the semiconductor wafer.

The cooling medium is desirably a gas since the gas does not pollute the semiconductor wafer. Examples of the gas include inert gases such as nitrogen, argon, helium and CFC, and air and the like.

In the ceramic heater of the first aspect of the present invention, the diameter of the ceramic substrate is desirably 200 mm or more. This is based on the following reason: as the ceramic heater has a larger diameter, the temperature in the semiconductor wafer becomes uneven more easily when the wafer is heated; therefore, the constitution of the first aspect of the present invention functions effectively. This is also because a semiconductor wafer having a large diameter can be put onto the substrate having such a large diameter.

It is particularly desirable that the diameter of the ceramic substrate is 12 inches (300 mm) or more. Such a ceramic substrate will be suitable for the mainstream of semiconductor wafers in the next generation.

The thickness of the ceramic substrate in the ceramic heater of the first aspect of the present invention is desirably 25 mm or less. If the thickness of the ceramic substrate is more than 25 mm, the temperature-following character deteriorates. The thickness thereof is desirably 0.5 mm or more. If the thickness is less than 0.5 mm, the strength itself of the ceramic substrate drops so that the ceramic substrate may easily be broken down. More desirably, the thickness is above 1.5 mm and 5 mm or less. If the thickness is more than 5 mm, heat is not easily conducted so that heating efficiency tends to drop. On the other hand, if the thickness is 1.5 mm or less, heat conducted in the ceramic substrate does not diffuse sufficiently so that a variation in temperature may be generated in the heating face. Moreover, the strength of the ceramic substrate drops so that the ceramic substrate may be broken down.

In the ceramic heater 10 of the first aspect of the present invention, it is desirable that bottomed holes 14 are made, from the side opposite to the heating face 11a, on which an object to be heated will be put, toward the heating face 11a in the ceramic substrate 11. Additionally, it is desirable that the bottoms of the bottomed holes 14 are formed nearer to the non convex body formed portion 110a than the resistance heating elements 12, and temperature-measuring elements (not illustrated), such as thermocouples, are settled in the bottomed holes 14.

The distance between the bottoms of the bottomed holes 14 and the non convex body formed portion 110a is desirably from 0.1 mm to ½ of the thickness of the ceramic substrate.

In this way, temperature-measuring positions are nearer to the non convex body formed portion 110a than the resistance heating elements 12, so that the temperature of the semiconductor wafer can be more precisely measured.

If the distance between the bottoms of the bottomed holes 14 and the non convex body formed portion 110a is less than 0.1 mm, heat is radiated so that a temperature distribution is formed in the heating face 11a. If the distance is more than ½ of the thickness, the ceramic substrate is easily affected by the temperature of the resistance heating elements so that temperature-control cannot be performed. Thus, a temperature distribution is formed in the heating face 11a, as well.

The diameter of the bottomed holes 14 desirably ranges from 0.3 to 5 mm. If the diameter is too large, heat-radiating property enhances. If the diameter is too small, processability deteriorates so that the distance to the non convex body formed portion 110a cannot be made equal.

As illustrated in FIG. 3, a plurality of bottomed holes 14 are desirably arranged symmetrically about the center of the ceramic substrate 11 and arranged into a cross form. This is because the temperature of the whole of the heating face can be measured.

Examples of the above-mentioned temperature-measuring element include a thermocouple, a platinum temperature-measuring resistor, a thermistor and the like.

Examples of the above-mentioned thermocouple include K, R, B, S, E, J and T type thermocouples, as described in JIS-C-1602 (1980). Among these, the K type thermocouple is preferable.

Desirably, the size of the connecting portions of the thermocouple is equal to or larger than the strand diameter of the thermocouple, and is 0.5 mm or less. If the connecting portion is large, the heat capacity is large so that the response is slow. It is difficult to make size smaller than the strand diameter of the thermocouple.

The above-mentioned temperature-measuring elements may be bonded to the bottoms of the bottomed holes 14 with brazing gold, brazing silver and the like, or may be inserted into the bottomed holes 14 and then sealed with a heat-resistant resin. The two may be used together.

Examples of the above-mentioned heat resistant resin include thermosetting resins, in particular epoxy resin, polyimide resin, and bismaleimide-triazine resin. These resins may be used alone or in combination of two or more kinds thereof.

The above-mentioned brazing gold is desirably at least one selected from an alloy of 37 to 80.5% by weight of Au and 63 to 19.5% by weight of Cu, and an alloy of 81.5 to 82.5% by weight of Au and 18.5 to 17.5% by weight of Ni. These have a melting temperature of 900° C. or more and do not melt easily even in high temperature regions.

Examples of the brazing silver materials which can be used include Ag—Cu alloy.

The ceramic which forms the ceramic heater of the first aspect of the present invention is desirably a nitride ceramic or a carbide ceramic.

The nitride ceramic or the carbide ceramic has a smaller thermal expansion coefficient than metals and has a far higher mechanical strength than metals. Therefore, even if the thickness of the ceramic substrate is made small, the ceramic substrate is not warped or distorted by heating. For this reason, the ceramic substrate can be made thin and light. Since the ceramic substrate has a high thermal conductivity and the ceramic substrate itself is thin, the surface temperature of the ceramic substrate follows a change in the temperature of the resistance heating elements rapidly. That is, by changing a voltage or an electric current value to change the temperature of the resistance heating elements, the surface temperature of the ceramic substrate can be controlled.

Examples of the above-mentioned nitride ceramic include aluminum nitride, silicon nitride, boron nitride, titanium nitride and the like. These may be used alone or in combination of two or more kinds thereof.

Examples of the carbide ceramic include silicon carbide, zirconium carbide, titanium carbide, tantalum carbide, tungsten carbide and the like. These may be used alone or in combination of two or more kinds thereof.

Among these, aluminum nitride is most preferable. This is because it has the highest thermal conductivity, that is, 180 W/m·K and it has a superior temperature-following character.

When a nitride ceramic, a carbide ceramic and the like are used as the ceramic substrate, an insulating layer may be formed if necessary. Regarding a nitride ceramic, the volume resistance value thereof tends to drop at high temperature by solid solution of oxygen and the like. A carbide ceramic has an electric conductivity unless the ceramic is particularly made to be of high purity. By forming the insulating layer, a short between the circuits is prevented at high temperature or even if it contains impurities. Thus, temperature-controllability can be ensured.

The above-mentioned insulating layer is desirably an oxide ceramic. Specifically, silica, alumina, mullite, cordierite, beryllia and the like can be used.

Such an insulating layer may be formed by spin-coating the ceramic substrate with a sol solution wherein an alkoxide is hydrolyzed and polymerized, and then drying and firing the solution, or by sputtering, CVD and the like. The surface of the ceramic substrate may be subjected to oxidation-treatment to deposit an oxide layer.

The above-mentioned insulating layer is desirably from 0.1 to 1000 $\mu$m thick. If the thickness thereof is less than 0.1 $\mu$m, insulation cannot be ensured. If the thickness is over 1000 $\mu$m, heat conductivity from the resistance heating elements to the ceramic substrate is hindered.

Furthermore, the volume resistivity of the above-mentioned insulating layer is desirably 10 or more times larger than that of the above-mentioned ceramic substrate (at the same measurement temperature), because, in the case of less than 10 times, a short between the circuits cannot be prevented.

The ceramic substrate of the first aspect of the present invention desirably contains carbon. The content thereof is desirably from 200 to 5000 ppm. This is because the electrode can be concealed and black-body radiation is easily used.

The brightness of the above-mentioned ceramic substrate is desirably N6 or less as a value according to the definition of JIS Z 8721. This is because the ceramic substrate having a brightness of this degree is superior in heat radiation capacity and electrode-concealing ability.

The brightness N is defined as follows: the brightness of ideal black is made to 0; that of ideal white is made to 10; respective colors are divided into 10 parts in the manner that the brightness of the respective colors is recognized stepwise between the brightness of black and that of white at equal intensity intervals; and the resultant parts are indicated by symbols N0 to N10, respectively.

Actual brightness is measured by comparison with color chips corresponding to N0 to N10. One place of decimals in this case is made to 0 or 5.

In the first aspect of the present invention, the resistance heating elements may be formed on the surface (bottom face) of the ceramic substrate, or embedded in the ceramic substrate.

In the case that the resistance heating elements are formed inside the ceramic substrate, the resistance heating elements are desirably formed at positions within 60% or less of the thickness from the face opposite to the heating face. In the case of more than 60%, the resistance heating elements are too near to the heating face. As a result, heat conducted in the ceramic substrate does not diffuse sufficiently so that a temperature-variation in the heating face is generated.

In the case that the resistance heating elements are arranged inside the ceramic substrate, plural resistance heating element formed layers may be made. In this case, the patterns of the respective layers are desirably in the state that any one of the resistance heating elements is formed on some layer so as to be complementary to each other and, when viewed from a position above the heating face, the patterns are formed in all areas. An example of such a structure is a staggered arrangement.

The resistance heating elements may be set inside the ceramic substrate and be partially made exposed.

In the case that the resistance heating elements are formed on the surface of the ceramic substrate, the heating face is desirably on the side opposite to the face on which the resistance heating elements are formed. This is because temperature evenness in the heating face can be improved since the ceramic substrate plays a role in thermal diffusion.

In the case that the resistance heating elements are formed on the surface of the ceramic substrate, the following method is preferable: a method of applying a conductor containing paste containing metal particles to the surface of the ceramic substrate to form a conductor containing paste layer having a given pattern, and firing this to sinter the metal particles on the surface of the ceramic substrate. In the sintering of the metal, the sintering is sufficient if the metal particles are fusion-bonded to each other, and the metal particles and the ceramic are fusion-bonded to each other.

When the resistance heating elements are formed inside the ceramic substrate, the thickness thereof is preferably from 1 to 50 $\mu$m. When the resistance heating elements are formed on the surface of the ceramic substrate, the thickness of the resistance heating elements is preferably from 1 to 30 $\mu$m, more preferably from 1 to 10 $\mu$m.

When the resistance heating elements are formed inside the ceramic substrate 11, the width of the resistance heating elements is preferably from 5 to 20 $\mu$m. When the resistance heating elements are formed on the surface of the ceramic substrate 11, the width of the resistance heating elements is preferably from 0.1 to 20 mm, more preferably from 0.1 to 5 mm.

The resistance value of the resistance heating elements can be changed depending on their width or thickness. However, the above-mentioned ranges are most practical. The resistance value becomes larger as the resistance heating elements become thinner and narrower. The thickness and the width of the resistance heating elements are larger in the case wherein the resistance heating elements are formed inside the ceramic substrate. However, when the resistance heating elements are formed inside, the distance between the heating face and the resistance heating elements becomes short so that the evenness of the temperature in the surface becomes poor. Thus, it is necessary to make the width of the resistance heating elements themselves large. Since the resistance heating elements are formed inside, it is unnecessary to consider the adhesiveness to a nitride ceramic and the like. Therefore, it is possible to use a high melting point metal such as tungsten or molybdenum, or a carbide of tungsten, molybdenum and the like. Thus, the resistance value can be raised, and the thickness itself may be made large in order to prevent wire-snapping and so on. For these reasons, the resistance heating elements desirably have the above-mentioned thickness and width.

By setting the position where the resistance heating elements are formed in this way, heat generated from the resistance heating elements diffuses to the whole of the ceramic substrate while the heat is conducted. Thus, a temperature distribution in the face for heating an object to be heated (semiconductor wafer) is made even so that the temperatures of respective portions of the object to be heated are made even.

The pattern of the resistance heating elements in the ceramic heater of the first aspect of the present invention is not limited to the concentric circle pattern illustrated in FIG. 3, and may for example be a spiral pattern, an eccentric circle pattern, a pattern of repeated winding lines and the like. These patterns may be used together.

By making the resistance heating element pattern formed in the outermost circumference into a pattern divided in the circumferential direction, it is possible to perform minute control of temperature on the outermost circumference of the ceramic heater, wherein the temperature of which tends to fall. Thus, a variation in the temperature of the ceramic heater can be suppressed. Furthermore, the resistance heating element pattern divided in the circumferential direction may be formed in the inner portion of the ceramic substrate, as well as in the outermost circumference.

The resistance heating elements may have a rectangular section or an elliptical section, but they desirably have a flat section. In the case of the flat section, heat is more easily radiated toward the heating face. Thus, a temperature distribution in the heating face is not easily generated.

The aspect ratio (the width of the resistance heating element/the thickness of the resistance heating element) of the section is desirably from 10 to 5000.

Adjustment thereof into this range makes it possible to increase the resistance value of the resistance heating elements and keep the evenness of the temperature in the heating face.

In the case that the thickness of the resistance heating elements is made constant, the amount of heat which propagates to the direction of the heating face of the ceramic substrate becomes small if the aspect ratio is smaller than the above-mentioned range. Thus, a thermal distribution similar to the pattern of the resistance heating elements is generated in the heating face. On the other hand, if the aspect ratio is too large, the portions just above the centers of the resistance heating elements reach a high temperature so that a thermal distribution similar to the pattern of the resistance heating elements is generated in the heating face. Accordingly, if temperature distribution is considered, the aspect ratio of the section is preferably from 10 to 5000.

When the resistance heating elements are formed on the surface of the ceramic substrate, the aspect ratio is desirably from 10 to 200. When the resistance heating elements are formed inside the ceramic substrate, the aspect ratio is desirably from 200 to 5000.

The aspect ratio is larger in the case that the resistance heating elements are formed inside the ceramic substrate. This is based on the following reason. If the resistance heating elements are formed inside, the distance between the heating face and the resistance heating elements becomes short so that temperature evenness in the surface deteriorates. It is therefore necessary to make the resistance heating elements themselves flat.

The conductor containing paste used when the resistance heating elements are formed is not particularly limited, and is preferably a paste comprising not only metal particles or a conductive ceramic for ensuring electrical conductivity but also a resin, a solvent, a thickener and so on.

The above-mentioned metal particles are preferably made of, for example, a noble metal (gold, silver, platinum or palladium), lead, tungsten, molybdenum, nickel and the like. Among these metals, noble metals (gold, silver, platinum and palladium) are more preferable. These may be used alone, but desirably in combination of two or more kinds thereof. These metals are relatively not easily oxidized, and have a resistance value sufficient for generating heat.

Examples of the above-mentioned conductive ceramic include carbides of tungsten and molybdenum and the like. These may be used alone or in combination of two or more kinds thereof.

The particle diameter of these metal particles or the conductive ceramic particles is preferably from 0.1 to 100 $\mu$m. If the particle diameter is too small, that is, less than 0.1 $\mu$m, they are easily oxidized. On the other hand, if the particle diameter is over 100 $\mu$m, they are not easily sintered so that the resistance value becomes large.

The shape of the metal particles may be spherical or scaly. When these metal particles are used, they may be a mixture of above-mentioned spherical particles and scaly particles.

In the case that the metal particles are scaly or a mixture of spherical particles and scaly particles, metal oxides among the metal particles are easily held and adhesiveness between the resistance heating elements and the nitride ceramic and the like is ensured. Moreover, the resistance value can be made large. Thus, this case is profitable.

Examples of the resin used in the conductor containing paste include epoxy resins, phenol resins and the like. Examples of the solvent include isopropyl alcohol and the like. Examples of the thickener include cellulose and the like.

It is desirable to add a metal oxide to the metal particles in the conductor containing paste and make the resistance heating element as a sintered body of the metal particles and the metal oxide, as described above. By sintering the metal oxide together with the metal particles in this way, the nitride ceramic or the carbide ceramic constituting the ceramic substrate can be closely adhered to the metal particles.

The reason why the adhesiveness to the nitride ceramic or the carbide ceramic is improved by mixing the metal oxide is unclear, but would be based on the following. The surface of the metal particles, and the surface of the nitride ceramic or the carbide ceramic are slightly oxidized so that oxidized films are formed. The oxidized film are sintered and integrated with each other through the metal oxide so that the metal particles and the nitride ceramic or the carbide ceramic are closely adhered to each other.

A preferred example of the above-mentioned metal oxide is at least one selected from the group consisting of lead oxide, zinc oxide, silica, boron oxide ($B_2O_3$), alumina, yttria, and titania.

This is because these oxides make it possible to improve adhesiveness between the metal particles and the nitride ceramic or the carbide ceramic without increasing the resistance value of the resistance heating elements.

When the total amount of the metal oxides is set to 100 parts by weight, the weight ratio of above-mentioned lead oxide, zinc oxide, silica, boron oxide ($B_2O_3$), alumina, yttria and titania is as follows: lead oxide: 1 to 10, silica: 1 to 30, boron oxide: 5 to 50, zinc oxide: 20 to 70, alumina: 1 to 10, yttria: 1 to 50 and titania: 1 to 50. The weight ratio is desirably adjusted within the scope that the total thereof is not over 100 parts by weight.

By adjusting the amounts of these oxides within these ranges, particularly adhesiveness to the nitride ceramic can be improved.

The addition amount of the above-mentioned metal oxides to the metal particles is preferably 0.1% by weight or more and less than 10% by weight.

As the resistance heating elements, a metal foil or a metal wire may be used. As the above-mentioned metal foil, desirable is a resistance heating element obtained by patterning a nickel foil or a stainless steel foil by etching and the like. The patterned metal foils may be adhered with a resin film and the like. Examples of the metal wire include a tungsten wire, a molybdenum wire and the like.

When the resistance heating elements are formed, the area resistivity is preferably from 0.1 to 10 $\Omega/\square$. If the area resistivity is less than 0.1 $\Omega/\square$, the width of the pattern of the resistance heating elements must be made as superfine as about 0.1 to 1 mm to ensure the calorific value. Therefore, wire-snapping is caused by a slight crack of the pattern and the like, or the resistance value varies. If the area resistivity is over 10 $\Omega/\square$, the calorific value cannot be ensured unless the width of the pattern of the resistance heating elements is made large. Consequently, the flexibility of pattern design deteriorates so that it becomes difficult to make the temperature of the heating face even.

In the case that the resistance heating elements are formed on the surface of the ceramic substrate 21, a metal covering layer 220 (see FIG. 5) is desirably formed on the surface portion of the resistance heating elements. This is because a change in the resistance value caused by oxidization of the inner metal sintered body is prevented. The thickness of the metal covering layer 220 to be formed is preferably from 0.1 to 10 μm.

The metal used when the metal covering layer 220 is formed is not particularly limited if the metal is a non-oxidizable metal. Specific examples thereof include gold, silver, palladium, platinum, nickel and the like. These may be used alone or in combination of two or more kinds thereof. Among these metals, nickel is preferable.

The resistance heating element 22 requires a terminal to connect itself to a power source. This terminal is fixed to the resistance heating element 22 through solder. Nickel is preferable because nickel prevents thermal diffusion from solder. An example of the connecting terminal is an external terminal 23 made of Kovar.

In the case that the resistance heating elements are formed inside the ceramic substrate as illustrated in FIGS. 2 and 3, the surfaces of the resistance heating elements are not oxidized. Therefore, no covering is necessary. In the case the resistance heating elements are formed inside the ceramic substrate, a portion of the resistance heating elements may be exposed at the surface. Conductor-filled through holes for connecting the resistance heating elements may be provided in the terminal portions, and terminals may be connected and fixed to the conductor-filled through holes.

In the case that the connecting terminal is connected, an alloy such as silver-lead, lead-tin or bismuth-tin can be used as a solder. The thickness of the solder layer is preferably from 0.1 to 50 μm. This is because this range is a range sufficient for ensuring the connection through the solder.

In the case that an electrostatic electrode layer is formed inside the ceramic substrate of the first aspect of the present invention, the above-mentioned ceramic substrate functions as an electrostatic chuck. In this case, the ceramic substrate constituting this electrostatic chuck is constituted in the same manner as the above-mentioned ceramic heater except that the electrostatic electrode is formed.

Figure 8:
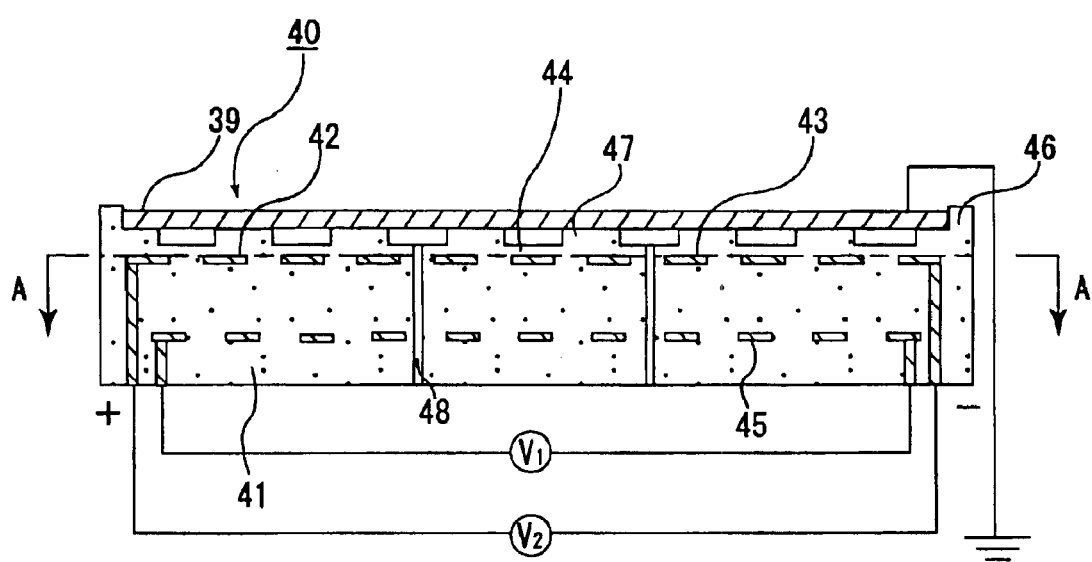
FIG. 8 is a partially enlarged sectional view which schematically shows an example of an electrostatic chuck using the ceramic substrate of the first aspect of the present invention.
Figure 9:
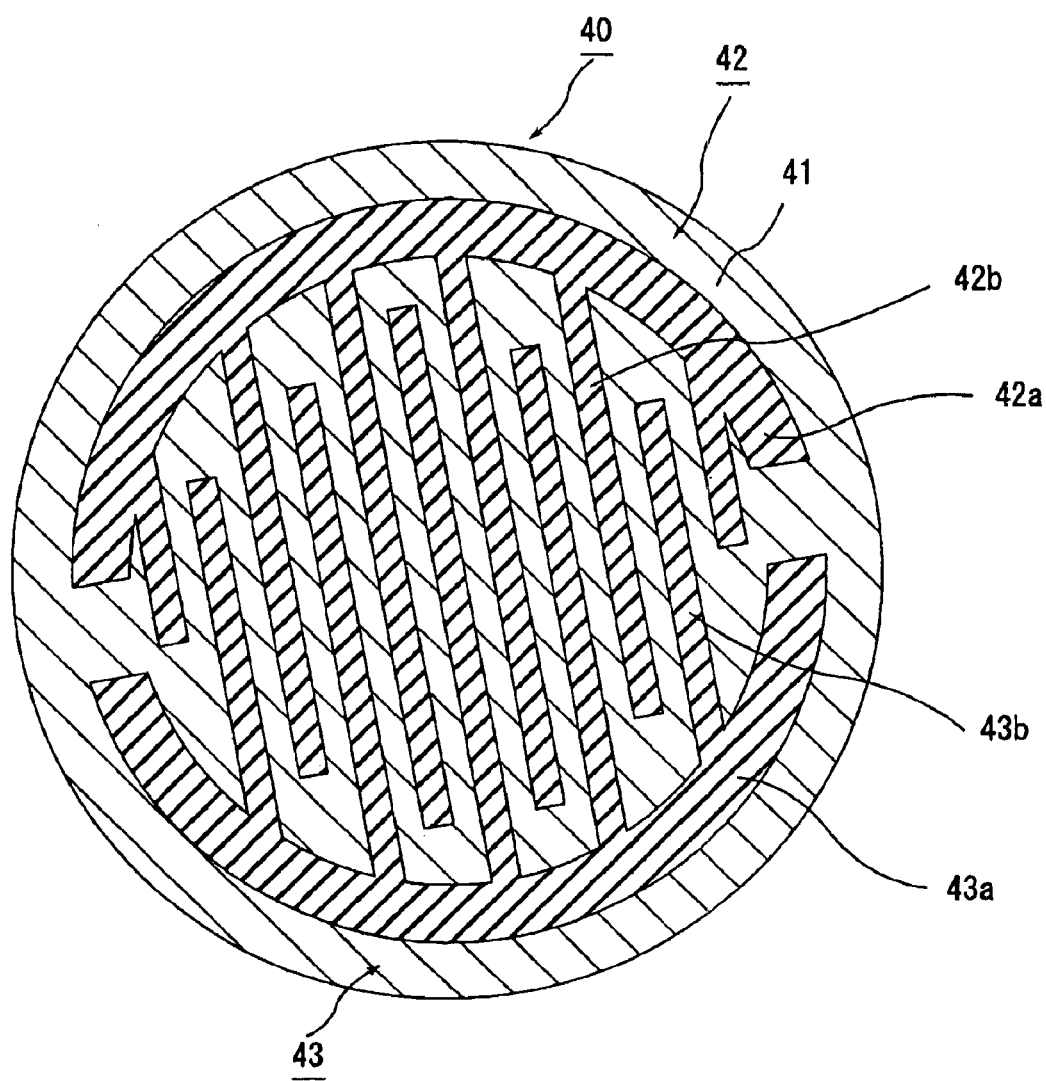
FIG. 9 is a horizontal sectional view which schematically shows the shape of an electrostatic electrode constituting the electrostatic chuck according to the first aspect of the present invention.

FIG. 8 is a vertical sectional view which schematically shows one embodiment of an electrostatic chuck according to the first aspect of the present invention. FIG. 9 is a cross section view taken on A—A line of the electrostatic chuck shown in FIG. 8.

In this electrostatic chuck 40, an annular projected portion 46 is provided along the periphery of a disc-form ceramic substrate 41 in the same manner as in the above-mentioned ceramic heater, and a great number of convex bodies 47 are formed inside it. An electrostatic electrode layer composed of a chuck positive electrostatic layer 42 and a chuck negative electrostatic layer 43 is embedded in the ceramic substrate 41. A thin ceramic layer 44 (hereinafter referred to as a ceramic dielectric film) is formed on this electrostatic electrode layer. A silicon wafer 39 is placed on the electrostatic chuck 40 and is earthed. Furthermore, on a non convex body formed portion, through holes 48 for ventilation, which reach the bottom face, are formed.

The thickness of the ceramic dielectric film, which comprises the convex bodies 47, is preferably from 5 to 5000 μm. This is because a silicon wafer is adsorbed with a sufficient adsorbing power while breakdown voltage is kept high.

As shown in FIG. 9, the chuck positive electrostatic layer 42 is composed of a semicircular arc part 42a and a combteeth-shaped part 42b. The chuck negative electrostatic layer 43 is also composed of a semicircular arc part 43a and a combteeth-shaped part 43b. The chuck positive electrostatic layer 42 and chuck negative electrostatic layer 43 are arranged face-to-face in such a manner that the teeth of one combteeth-shaped part 42b extend in staggered relation with the teeth of the other combteeth-shaped part 43b. The positive side and the negative side of a direct current power source are connected to the chuck positive electrostatic layer 42 and chuck negative electrostatic layer 43, respectively. Thus, a direct current voltage $V_2$ is applied thereto.

In order to control the temperature of the semiconductor wafer 39, resistance heating elements 45 in the form of concentric circles as viewed from the above, like the resistance heating elements 12 shown in FIG. 3, are set up inside the ceramic substrate 41. External terminals are connected and fixed to both ends of each of the resistance heating elements 45, and a voltage $V_1$ is applied thereto. Although not illustrated in FIGS. 8 and 9, bottomed holes for inserting temperature-measuring elements, and through holes for lifter pins for letting lifter pins, that support the silicon wafer 39 and move it up and down, pass through, are formed in the ceramic substrate 41. The resistance heating elements may be formed on the bottom face of the ceramic substrate (see FIG. 5).

When this electrostatic chuck 40 is caused to work, a direct current voltage $V_2$ is applied to the chuck positive electrostatic layer 42 and the chuck negative electrostatic layer 43. In this way, the semiconductor wafer 39 is adsorbed and fixed onto the chuck positive electrode and the chuck negative electrode through the ceramic dielectric film 44 by electrostatic effect of the chuck positive electrostatic layer 42 and the chuck negative electrostatic layer 43. The semiconductor wafer 39 is fixed onto the electrostatic chuck 40 in this way, and subsequently the semiconductor wafer 39 is subjected to various treatments such as CVD.

The electrostatic chuck according to the first aspect of the present invention can promptly raise or lower the temperature thereof in the same manner as in the case of the above-mentioned ceramic heater. Moreover, the temperature of the semiconductor wafer can be made even. Since the convex bodies in large numbers are formed on the surface of the ceramic substrate and the surface is not a plane, de-chuck can easily be performed. By introducing a heating medium or a cooling medium into the non convex body formed portion through the through holes 48 for ventilation, heating or cooling can be more promptly performed. Furthermore, by sucking atmospheric gas through the through holes 48 for ventilation, the semiconductor wafer can be more firmly adsorbed and fixed to the ceramic substrate.

Examples of the above-mentioned electrostatic electrodes include a sintered body of a metal or a conductive ceramic; a metal foil; and the like. As the metal sintered body, at least one selected from tungsten and molybdenum is preferable. The metal foil is desirably made of the same material for the metal sintered body. These metals are relatively not easily oxidized and have a sufficient conductivity for electrodes. As the conductive ceramic, at least one selected from carbides of tungsten and molybdenum can be used.

Figure 10:
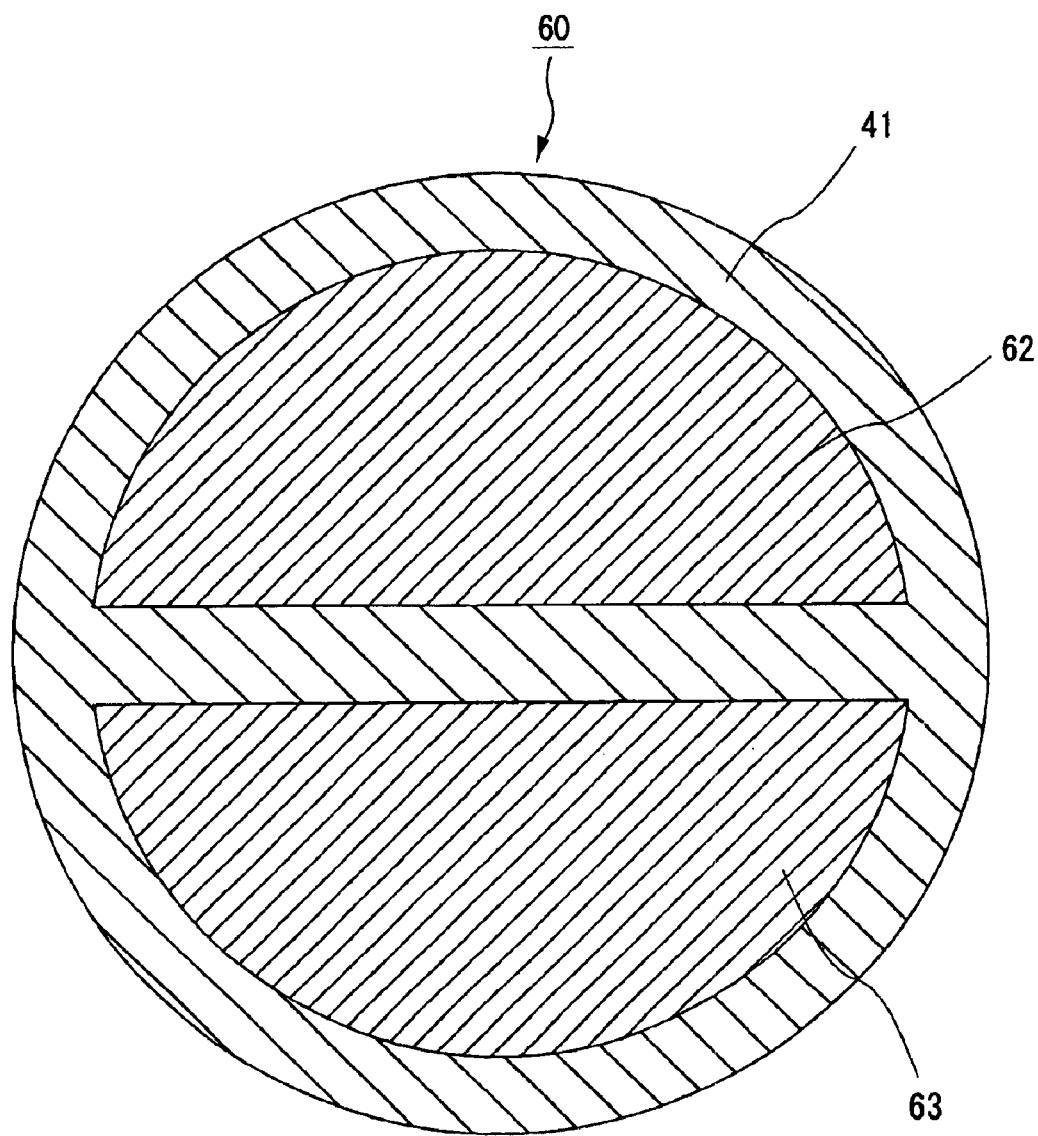
FIG. 10 is a horizontal sectional view which schematically shows the shape of an electrostatic electrode constituting an electrostatic chuck according to the first aspect of the present invention.
Figure 11:
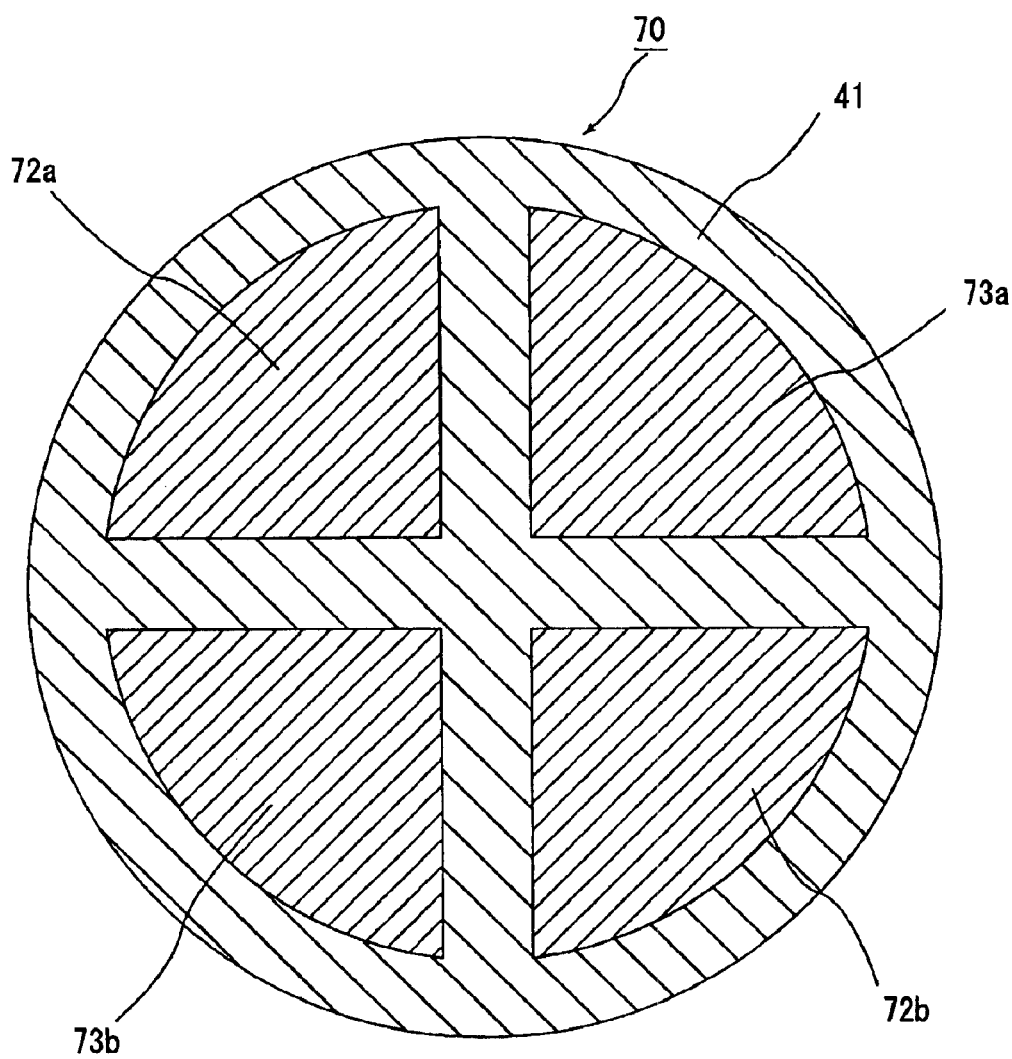
FIG. 11 is a horizontal sectional view which schematically shows the shape of an electrostatic electrode constituting an electrostatic chuck according to the first aspect of the present invention.

FIGS. 10 and 11 are horizontal cross section views, each of which schematically illustrates electrostatic electrodes in a different electrostatic chuck. In an electrostatic chuck 60 illustrated in FIG. 10, a chuck positive electrostatic layer 62 and a chuck negative electrostatic layer 63 in a semicircular form are formed inside a ceramic substrate 41. In an electrostatic chuck 70 illustrated in FIG. 11, chuck positive electrostatic layers 72a and 72b and chuck negative electrostatic layers 73a and 73b, each of which is quartered-circle shaped, are formed inside a ceramic substrate 41. The two chuck positive electrostatic layers 72a and 72b and the two chuck negative electrostatic layers 73a and 73b are formed to cross each other.

In the case the electrodes are formed into segments of a circle and the like, the number of segments is not particularly limited and may be five or more. The shape thereof is not limited to a sector.

By providing a chuck top conductor layer on the surface of the ceramic substrate of the first aspect of the present invention and providing guard electrodes, ground electrodes and the like inside of the ceramic substrate, the ceramic substrate functions as a chuck top plate for a wafer prober.

The following will describe a method for manufacturing the ceramic heater according to the first aspect of the present invention.

First, a method for manufacturing the ceramic heater wherein the resistance heating elements 12 are formed inside the ceramic substrate 11 (see FIGS. 1 to 3) will be described according to FIG. 12.

(1) Step of Manufacturing a Ceramic Substrate

First, powder of a ceramic such as a nitride ceramic is mixed with a binder, a solvent and the like to prepare a paste. This is used to form a green sheet 50.

As the above-mentioned powder of a ceramic such as a nitride, aluminum nitride and the like can be used. If necessary, a sintering aid such as yttria, a compound containing Na or Ca, and the like may be added.

As the binder, at least one selected from an acrylic binder, ethylcellulose, butylcellosolve, and polyvinyl alcohol is desirable.

As the solvent, at least one selected from α-terpineol and glycol is desirable.

A paste obtained by mixing these is formed into a sheet form by doctor blade method, to manufacture green sheets.

The thickness of the green sheet is preferably from 0.1 to 5 mm.

(2) Step of Printing a Conductor Containing Paste on the Green Sheet

A metal paste or a conductor containing paste, which contains a conductive ceramic, for forming resistance heating elements 12 is printed on the green sheet 50 to form a conductor containing paste layer 120. A conductor containing paste filling layer 190 for conductor-filled through holes 19 is formed in through holes.

This conductor containing paste contains metal particles or conductive ceramic particles.

The above-mentioned metal particles are not particularly limited, and examples thereof include tungsten particles, molybdenum particles and the like. The average particle diameter of these metal particles is preferably from 0.1 to 5 μm. If the average particle diameter is less than 0.1 μm or over 5 μm, the conductor containing paste is not easily printed.

The above-mentioned conductive ceramic particles are not particularly limited, and examples thereof include tungsten carbide, molybdenum carbide and the like.

Such a conductor containing paste may for example be a composition (paste) obtained by mixing 85 to 87 parts by weight of the metal particles or the conductive ceramic particles; 1.5 to 10 parts by weight of at least one binder selected from acrylic binders, ethylcellulose, butylcellosolve and polyvinyl alcohol; and 1.5 to 10 parts by weight of at least one solvent selected from α-terpineol and glycol.

(3) Step of Laminating the Green Sheets

Green sheets 50 on which no conductor containing paste is printed are laminated on upper and lower sides of the green sheet 50 on which the conductor containing paste is printed (see FIG. 12(a)).

At this time, the lamination is performed in such a manner that the position of the green sheet 50 on which the conductor containing paste is printed is within 60% or less, from the bottom face, with respect to the thickness of the laminated green sheets.

Specifically, the number of the green sheets laminated on upper side is preferably from 20 to 50, and that of the green sheets laminated on the lower side is preferably from 5 to 20.

Thereafter, a green sheet lamination is formed by thermal pressure-bonding. At the time of this thermal pressure-bonding, a pressing mold having a shape for forming a projected portion or convex bodies on upper face may be used. In this case, however, it is necessary to perform firing in such a manner that the shape is not broken at the time of hot press in the next step. Usually, it is desirable that after a sintered body is manufactured, working is performed to form a projected portion or convex bodies, as described later.

(4) Step of Firing the Green Sheet Lamination

The green sheet lamination is heated and pressed to sinter the green sheets and the inner conductor containing paste.

Heating temperature is preferably from 1000° C. to 2000° C., and pressing pressure is preferably from 10 to 20 MPa. The heating is performed in the atmosphere of an inert gas. As the inert gas, argon, nitrogen and the like can be used.

The surface of the resultant sintered body is subjected to grinding with a drill to form a projected portion 16, which is for fitting the semiconductor wafer 39, on the sintered body and form many convex bodies 17, which contact the semiconductor wafer 39, inside the projected portion 16 (see FIG. 12(b)). Upper part of the convex body 17 is desirably constituted by a plane.

Furthermore, the entire surface is subjected to physical or chemical roughening treatment such as plasma etching or HF/HNO$_3$ mixed acid treatment to make the whole surface of the ceramic substrate rough. Thereafter, upper face of the convex body is polished by polishing with diamond paste. Since the peripheral projected portion is higher than the convex bodies, a member having a diameter smaller than that of the peripheral projected portion is used as a polishing member.

Next, in the resultant sintered body, the following are made: through holes 15 for lifter pins for letting lifter pins 36 for supporting the semiconductor wafer 39 pass through; bottomed holes 14, in which temperature measuring elements such as thermocouples are embedded; and so on. Moreover, conductor-filled through holes 19 for connecting the resistance heating elements 12 to the external terminals 13 are exposed at the outside. Furthermore, through holes 18 for ventilation are desirably formed (see FIG. 12(c)).

The above-mentioned step of forming the through holes and the bottomed holes may be applied to the above-mentioned green sheet lamination, but is desirably applied to the sintered body. This is because the lamination may be deformed in the sintering step.

The through holes and the bottomed holes can be formed after surface-polishing by sandblast treatment. The external terminals 13 are connected to the conductor-filled through holes 19 for connecting the inner resistance heating elements 12 through solder and the like, and then heated and reflowed. Heating temperature is preferably from 200° C. to 500° C.

Furthermore, thermocouples (not illustrated) and the like as temperature measuring elements are fitted to the bottomed holes 14 with brazing silver, brazing gold and the like, and they are sealed up with a heat-resistant resin such as polyimide, to finish the manufacture of a ceramic heater 10 (see FIG. 12(d)).

Figure 13:
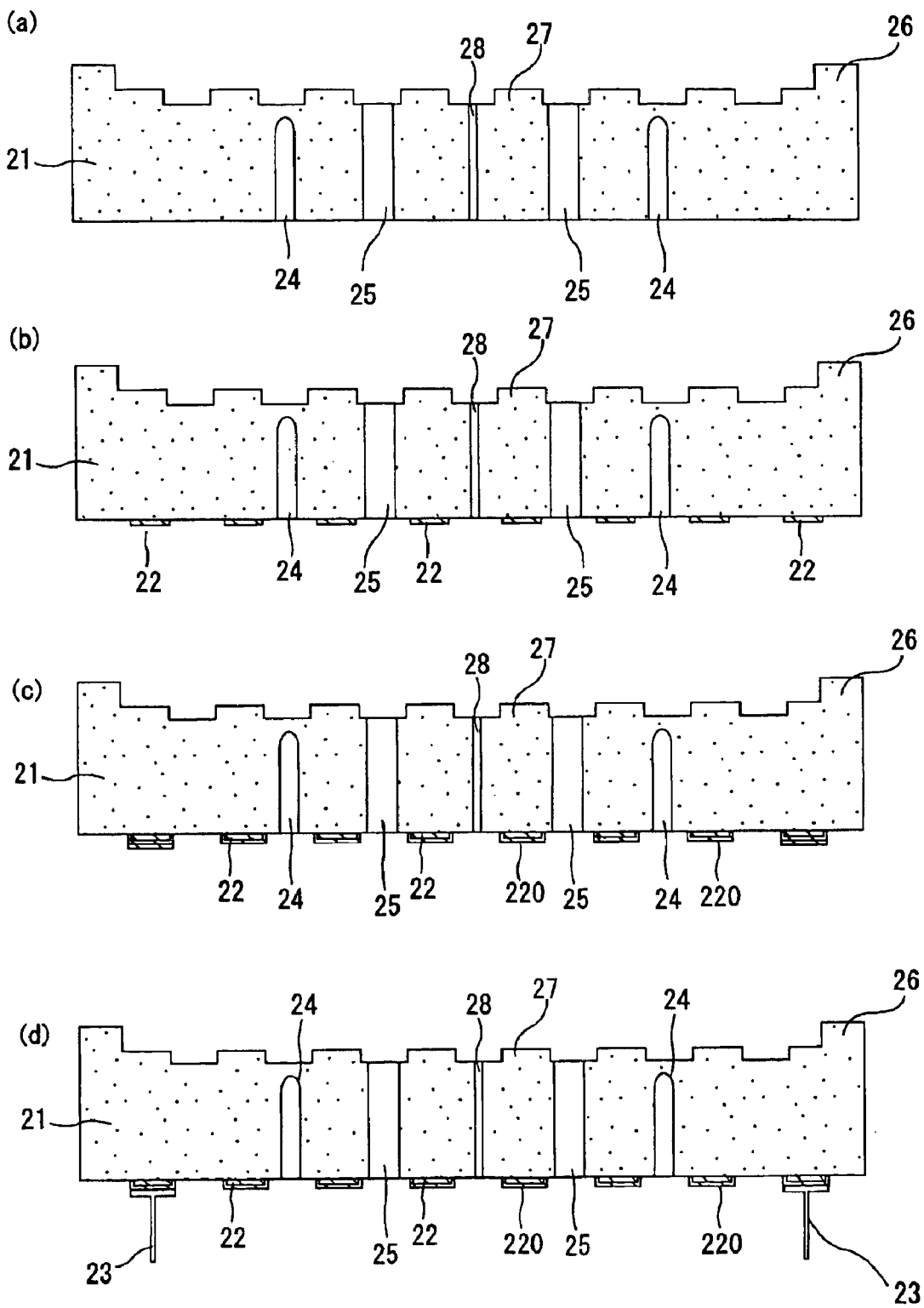
FIGS. 13(a) to 13(d) are sectional views which schematically show a part of the manufacturing method of the ceramic heater shown in FIG. 4.

The following will describe a method for manufacturing the ceramic heater 20 wherein the resistance heating elements 22 are formed on the bottom face of the ceramic substrate 21 (see FIGS. 4 and 5) according to FIG. 13.

(1) Manufacturing Process of a Ceramic Substrate

A sintering aid such as yttria (Y$_2$O$_3$) or B$_4$C, a compound containing Na or Ca, a binder and soon are blended as appropriate with powder of a nitride ceramic and the like such as the above-mentioned aluminum nitride or silicon carbide, to prepare a slurry. Thereafter, this slurry is made into a granular form by spray-drying and the like. The granule is put into a mold and pressed to be formed into a plate form and the like. Thus, a raw formed body (green) is formed.

Next, this raw formed body is heated and fired to be sintered. Thus, a plate made of ceramic is manufactured. Thereafter, the plate is made into a given shape to produce a ceramic substrate 21. The shape of the raw formed body may be such a shape that the sintered body can be used as it is. By heating and firing the raw formed body under pressure, the ceramic substrate 21 having no pores can be manufactured. It is sufficient that the heating and the firing are performed at sintering temperature or higher. The firing temperature is from 1000° C. to 2500° C. for nitride ceramic and carbide ceramic. The firing temperature is from 1500° C. to 2000° C. for oxide ceramic.

The resultant ceramic substrate 21 is subjected to drilling to form a projected portion 26 for fitting the semiconductor wafer 39 in the ceramic substrate 21 and form many convex bodies 27, which contact the semiconductor wafer 39, inside the projected portion 26.

Furthermore, drilling is performed to form portions which will be through holes 25 for lifter pins for letting lifter pins 36 for supporting the semiconductor wafer 39 pass through, and portions which will be bottomed holes 24, in which temperature measuring elements such as thermocouples are embedded. Moreover, it is desirable to form portions which will be through holes 28 for ventilation (see FIG. 13(a)).

By using a mold wherein convex and concave portions are formed to yield a desired shape in the heating and pressing step, the projected portion 26 and the convex bodies 27 may be formed.

(2) Process of Printing a Conductor Containing Paste on the Ceramic Substrate

A conductor containing paste is generally a highly viscous fluid comprising metal particles, a resin and a solvent. This conductor containing paste is printed on portions where the resistance heating elements 22 are to be arranged by screen printing and the like, to form a conductor containing paste layer.

The conductor containing paste layer is desirably formed in such a manner that a section of the resistance heating elements 22 after the firing will be rectangular and flat.

(3) Firing of the Conductor Containing Paste

The conductor containing paste layer printed on the bottom face of the ceramic substrate 21 is heated and fired to remove the resin and the solvent and further sinter the metal particles. Thus, the metal particles are baked onto the bottom face of the ceramic substrate 21 to form the resistance heating elements 22 (see FIG. 13(b)). The heating and firing temperature is preferably from 500° C. to 1000° C.

If the above-mentioned oxide is added to the conductor containing paste, the metal particles, the ceramic substrate and the oxide are sintered to be integrated with each other. Thus, the adhesiveness between the resistance heating elements 22 and the ceramic substrate 21 is improved.

(4) Step of Forming a Metal Covering Layer

Next, a metal covering layer 220 is deposited on the surface of the resistance heating elements 22 (see FIG. 13(c)). The metal covering layer 220 can be formed by electroplating, electroless plating, sputtering and the like. From the viewpoint of mass-productivity, electroless plating is optimal.

(5) Fitting of Terminals and so on

Terminals (external terminals 23) for connection to a power source are fitted up to ends of the pattern of the resistance heating elements 22 with solder. Thermocouples (not illustrated) are fixed to the bottomed holes 24 with brazing silver, brazing gold and the like. They are sealed up with a heat resistant resin such as polyimide, to finish the manufacture of the ceramic heater 20 (see FIG. 13(d)).

The ceramic substrate of the first aspect of the present invention can be used as an electrostatic chuck by providing an electrostatic electrode thereon. By providing a chuck top conductor layer on the surface of the ceramic substrate and providing guard electrodes and ground electrodes inside of the ceramic substrate, the ceramic substrate can be used as a chuck top plate used in a wafer prober.

The following will describe the ceramic substrate of the second aspect of the present invention.

The ceramic substrate of the second aspect of the present invention is a ceramic substrate for a semiconductor-producing/examining device having a resistance heating element formed on a surface thereof or inside thereof,
wherein
a large number of convex bodies, which make contact with a semiconductor wafer, are formed on a heating face thereof, upper part of the convex body is constituted by a plane, and the surface roughness Rmax, according to JIS B 0601, of a non convex body formed portion is from 1 to 100 μm, and is larger than the surface roughness Rmax of upper part of the convex body.

First, a case in which the ceramic substrate of the second aspect of the present invention is used as a ceramic heater will be described.

FIG. 14(a) is a plan view which schematically illustrates an example of a heating face of a ceramic heater according to the second aspect of the present invention, and FIG. 14(b) is a cross section view which schematically illustrates a part of the ceramic heater illustrated in FIG. 14(a).

As illustrated in FIG. 14(a), a ceramic substrate 81 is made in a disc form, and on a heating face 81a, on which an object to be heated such as a semiconductor wafer is settled, numerous convex bodies 87 which contact the semiconductor wafer are formed and further plural through holes 88 for ventilation, which reach the bottom face of the ceramic substrate 81, are made in the same manner as in the ceramic heater illustrated in FIG. 1.

As illustrated in FIG. 14(b), on a non convex body formed portion 810a, in which no convex bodies 87 are formed, a roughened face is formed. The surface roughness Rmax thereof is from 1 to 10 μm while the surface roughness Rmax of upper part of the convex body 87 is adjusted to a value smaller than the surface roughness of the non convex body formed portion 810a.

Accordingly, the roughened face formed in the non convex body formed portion 810a can cause heated atmospheric gas to remain. Moreover, since the surface roughness Rmax of upper part of the convex body 87 which directly contacts the object to be heated such as a semiconductor wafer is adjusted to a small value, the contact area between the object to be heated such as a semiconductor wafer and the convex bodies 87 can be made large. As a result, the temperature of the object to be heated such as a semiconductor wafer can be made even. Additionally, the object to be heated can be promptly heated.

In the present invention, the surface roughness Rmax, according to JIS B 0601, of upper part of the convex body is smaller than the Rmax of the non convex body formed portion and is desirably from 0.03 to 10 μm.

If the surface roughness is less than 0.03 μm, the contact area between the wafer and the convex bodies becomes too large, and a temperature distribution adversely becomes large. If the surface roughness is more than 10 μm, the contact area between the wafer and the convex bodies is small so that a temperature distribution in the wafer becomes large.

Plural through holes 88 for ventilation are desirably provided in the non convex body formed portion 810a. This is because a heating medium or a cooling medium is caused to flow through the through holes 88 for ventilation to heat or cool the semiconductor wafer and the like, whereby the temperature of the ceramic heater 80 can be more promptly raised or lowered.

Figure 14:
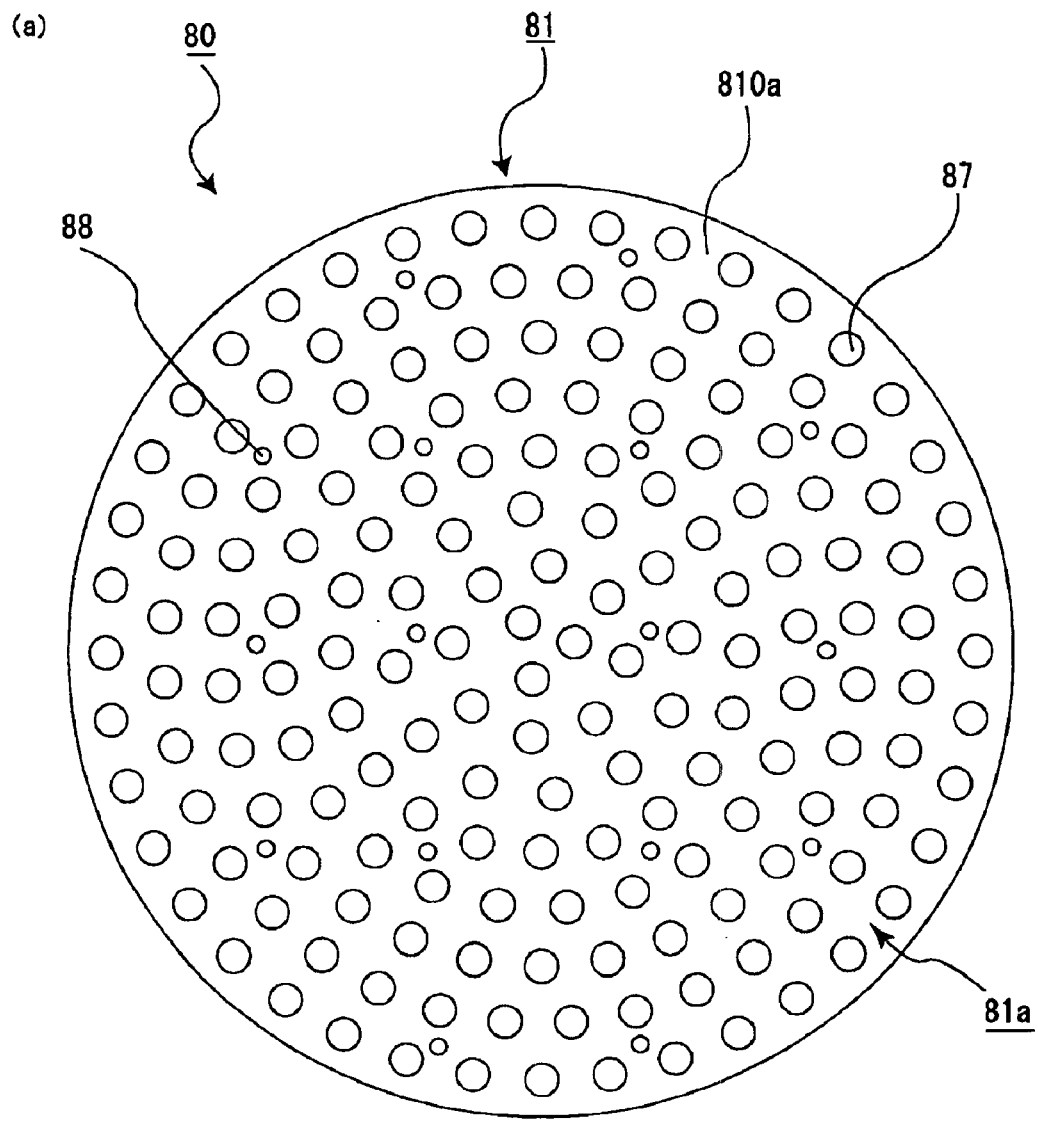
FIG. 14(a) is a plan view which schematically shows an example of a ceramic heater according to the second aspect of the present invention.
FIG. 14(b) is a partially enlarged sectional view which schematically shows a part of the ceramic heater shown in FIG. 14(a).
Figure 14:
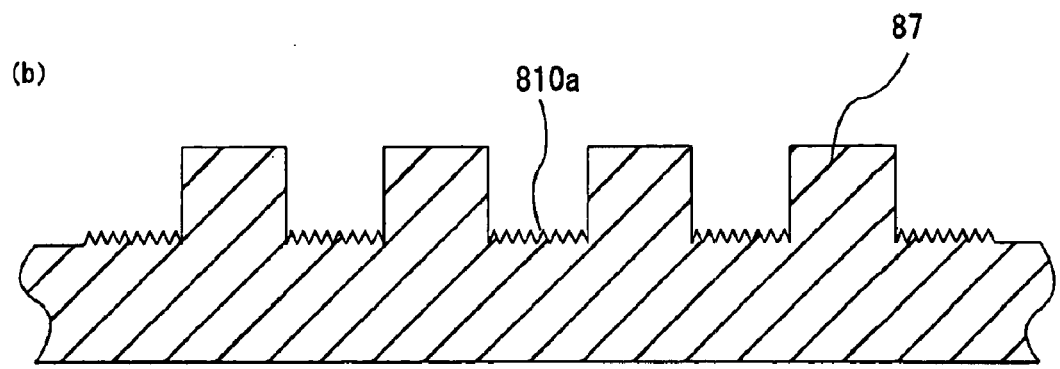

In the ceramic heater 80 illustrated in FIG. 14, a projected portion for fitting the semiconductor wafer is not formed along the periphery of the ceramic substrate 81. However, the projected portion may be formed in the same way as in the case of the ceramic heater 10 illustrated in FIG. 1.

In the ceramic heater 80, resistance heating elements are formed inside the ceramic substrate 81 or on the bottom face thereof in the same way as in the case of the first aspect of the present invention.

Other constitutions of the ceramic heater 80 are the same as in the case of the ceramic heater according to the first aspect of the present invention, thus detailed description thereof is omitted.

By providing an electrostatic electrode layer inside the ceramic substrate of the second aspect of the present invention, the ceramic substrate can be used as an electrostatic chuck.

By providing a chuck top conductor layer on the surface of the ceramic substrate of the second aspect of the present invention and providing guard electrodes, ground electrodes and so on inside the ceramic substrate, the ceramic substrate can be used as a chuck top plate for a wafer prober.

The following will describe the method for manufacturing a ceramic substrate for a semiconductor-producing/examining device of the present invention.

A method for manufacturing a ceramic substrate for a semiconductor-producing/examining device of the present invention is a method for manufacturing a ceramic substrate for a semiconductor-producing/examining device having: a resistance heating element formed on a surface thereof or inside thereof; and a large number of convex bodies, which make contact with a semiconductor wafer, formed on a heating face thereof, upper part of the convex body being constituted by a plane, wherein:

the method comprising at least the following steps (a) to (c):

(a) a ceramic substrate producing step of producing a ceramic substrate in which: the plurality of convex bodies are formed on the heating face; and a resistance heating element is formed on a surface thereof or inside thereof;

(b) a roughened face forming step of forming roughened face on upper part of the convex body and on a non convex body formed portion, which are the heating face of the ceramic substrate, by a physical and/or chemical method so as to set the surface roughness Rmax, according to JIS B 0601, of the non convex body formed portion to 1 to 100 μm; and (c) a smoothening step of subjecting upper part of the convex body to smoothing treatment so as to make the surface roughness Rmax of upper part of the convex body smaller than the surface roughness Rmax of the non convex body formed portion.

Figure 15:
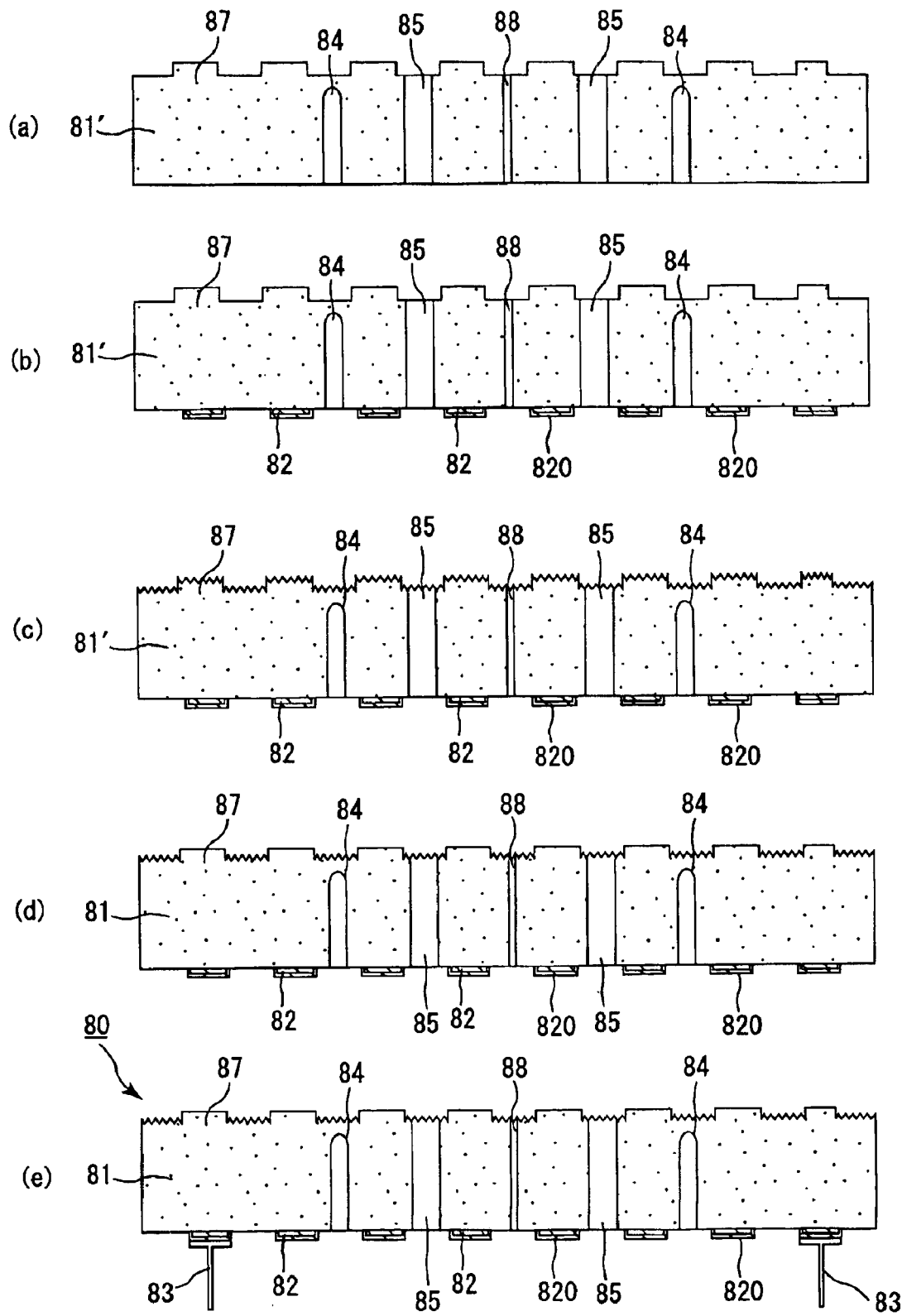
FIGS. 15(a) to 15(e) are sectional views which schematically show a part of the manufacturing method of the ceramic heater shown in FIG. 14.

The following will describe the method for producing a ceramic substrate of the present invention by way of an example of a ceramic heater wherein resistance heating elements are formed on the bottom face of a ceramic substrate, referring to FIG. 15.

First, the above-mentioned step (a) is performed, which is a ceramic substrate producing step of producing a ceramic substrate wherein a large number of convex bodies are made on the heating face thereof and further resistance heating elements are formed inside or on the surface thereof.

In the ceramic substrate producing step, a ceramic substrate 81' wherein resistance heating elements 82 are formed on the surface thereof is first produced (see FIG. 15(a)). The resistance heating elements 82 and a metal covering layer 820 are formed on the bottom face of the ceramic substrate 81' (see FIG. 15(b)).

The method for manufacturing this ceramic substrate 81' may be the same method for manufacturing a ceramic substrate in a ceramic heater according to the above-mentioned first aspect of the present invention. Thus, detailed description thereof is omitted.

The resistance heating elements 82 and the metal covering layer 820 may be formed after a ceramic substrate 81 is manufactured through subsequent steps.

A large number of convex bodies 87 are formed on the heating face of the thus-produced ceramic substrate 81'. No projected portion is formed along the periphery thereof. However, in the method for manufacturing the ceramic substrate of the present invention, a projected portion may be formed along the periphery thereof in the same way as in the case of the ceramic heater according to the above-mentioned first aspect of the present invention.

The ceramic substrate 81' is subjected to drilling and the like to form through holes 85 for inserting lifter pins for supporting a semiconductor wafer and the like, and bottomed holes 84, in which temperature measuring elements such as thermocouples are embedded. Further, through holes 88 for ventilation are desirably formed.

Next, the above-mentioned step (b) is performed, which is a roughened face forming step of forming roughened face on upper part of the convex body 87, which constitutes the heating face of the ceramic substrate 81', and on a non convex body formed portion by a physical and/or chemical method, to set the surface roughness Rmax of the non convex body formed portion to 1 to 100 $\mu$m.

The above-mentioned surface roughness Rmax means a height difference obtained by subtracting the height of the lowest position (valley) from that of the highest position (mountain), the heights being measured from arbitrary mean line.

Ra is a value obtained by integrating the absolute value of a sectional curve of a roughened face and then dividing the resultant value by a measured length, and is an average value of the heights of the irregularities. Even if the average roughness is adjusted, the contact between the roughened face and the wafer becomes a point contact when large undulations locally exist. As a result, the wafer does not contact the convex bodies sufficiently. The surface roughness is made large to cause atmospheric gas to remain. However, it has been found out that if the large undulations exist locally, heat is accumulated so much that the temperature in the heating face easily becomes uneven. Accordingly, it is necessary to adjust not the Ra but the Rmax. The Ra and the Rmax have no correlation. There may be a case where the Ra is 0.1 $\mu$m, while the Rmax is 10 $\mu$m. The average value of the heights is entirely different from the height difference in technical meaning.

The physical methods of forming the roughened face in the above-mentioned heating face are not particularly limited, and are desirably ion beam etching and plasma etching. Particularly, argon plasma etching and $CF_4$ plasma etching are optimal. The extent of the roughened face can be controlled by etching time.

The chemical method of forming the roughened face in the above-mentioned heating face is not particularly limited, and may for example be etching treatment and the like.

An etchant used in the above-mentioned etching treatment is not particularly limited, and examples thereof include $HF/HNO_3$ mixed acid and the like.

By such a physical method and/or a chemical method, it is possible to form the roughened face having a surface roughness Rmax of 1 to 100 $\mu$m on upper part of the convex body 87, which constitutes the heating face of the ceramic substrate 81', and in the non convex body formed portion (see FIG. 15(c)).

If the above-mentioned surface roughness Rmax is less than 1 $\mu$m, heated atmospheric gas cannot be caused to remain on the heating face of the ceramic substrate to be manufactured. Thus, heat-accumulating effect becomes poor, and an object to be heated, such as a semiconductor wafer, cannot be heated to an even temperature. Moreover, the semiconductor wafer cannot be promptly heated. On the other hand, if the above-mentioned surface roughness Rmax is more than 100 $\mu$m, heat is accumulated too much so that the semiconductor wafer cannot be evenly heated.

Then the above-mentioned step (c) is performed, which is a smoothening step of subjecting upper part of the convex body 87 to smoothing treatment to make the surface roughness Rmax of upper part of the convex body 87 smaller than the surface roughness Rmax of the non convex body formed portion.

The method of the smoothing treatment (grinding treatment) applied to upper part of the convex body 87 is not particularly limited. Examples thereof include grinding with a diamond grindstone, buffing, polishing with diamond paste, and mechanical grinding treatment with sandpaper and the like.

By applying such a grinding treatment to upper part of the convex body 87, the surface roughness Rmax thereof can be made smaller than the Rmax of the non convex body formed portion (see FIG. 15(d)).

By performing such a grinding step, it is possible to manufacture a ceramic substrate 81 wherein a large number of convex bodies 87, which contact a semiconductor wafer, are formed on the heating face; upper part of the convex body 87 is constituted by a plane; the surface roughness Rmax of the non convex body formed portion is from 1 to 100 $\mu$m and is larger than the surface roughness Rmax of upper part of the convex body 87.

As described above, resistance heating elements may be formed on the bottom face of the ceramic substrate 81 after manufacturing the ceramic substrate 81.

Thereafter, external terminals 83 are settled and the thermocouples are fitted to the bottomed holes 84 in the same way as in the ceramic heater according to the above-mentioned first aspect of the present invention, so as to finish the manufacture of a ceramic heater 80 (see FIG. 15(e)).

In the case in which the resistance heating elements are formed inside the ceramic substrate, the steps similar to the above-mentioned (b) and (c) may be performed after a ceramic substrate is produced in the same way described in the method for manufacturing the ceramic heater according to the above-mentioned first aspect of the present invention. In this manner, it is possible to produce a ceramic substrate wherein: resistance heating elements are formed inside thereof; numerous convex bodies, which contact a semiconductor wafer, are formed on the heating face thereof; upper part of the above-mentioned convex body is constituted by a plane; the surface roughness Rmax of the non convex body formed portion is from 1 to 100 $\mu$m and is larger than the surface roughness Rmax of upper part of the above-mentioned convex body.

In the present invention, the surface of the heating face of the ceramic substrate may be covered with magnesium fluoride or yttrium oxide.

This is because these films are not easily corroded by plasma. The thickness of the covering film is desirably from 0.1 to 100 $\mu$m.

According to the method for manufacturing a ceramic substrate of the present invention, an electrostatic chuck can be manufactured by forming resistance heating elements on the surface of a ceramic substrate or inside thereof, and further setting an electrostatic electrode inside the ceramic substrate.

A chuck top plate used in a wafer prober can be manufactured by forming resistance heating elements on the surface of a ceramic substrate or inside thereof, depositing a chuck top conductor layer on the surface of the ceramic substrate, and setting guard electrodes and ground electrodes inside of the ceramic substrate.

BEST MODE FOR CARRYING OUT THE INVENTION

The present invention will be described in more detail by means of Examples hereinafter.

EXAMPLE 1
Production of a Ceramic Heater (See FIGS. 1 to 3 and 12)

(1) The following paste was used to conduct formation by doctor blade method to obtain green sheets with a thickness of 0.47 mm: a paste obtained by mixing 100 parts by weight of aluminum nitride powder (made by Tokuyama Corp., average particle diameter: 0.6 μm), 4 parts by weight of alumina, 11.5 parts by weight of an acrylic resin binder, 0.5 part by weight of a dispersant and 53 parts by weight of alcohol containing 1-butanol and ethanol.

(2) Next, the green sheet was dried at 80° C. for 5 hours, and subsequently portions which would be conductor-filled through holes 19 were made by punching.

(3) The following were mixed to prepare a conductor containing paste A: 100 parts by weight of tungsten carbide particles having an average particle diameter of 1 μm, 3.0 parts by weight of an acrylic binder, 3.5 parts by weight of α-terpineol solvent, and 0.3 part by weight of a dispersant.

The following were mixed to prepare a conductor containing paste B: 100 parts by weight of tungsten particles having an average particle diameter of 3 μm, 1.9 parts by weight of an acrylic binder, 3.7 parts by weight of α-terpineol solvent, and 0.2 part by weight of a dispersant.

This conductor containing paste A was printed on the green sheet by screen printing, so as to form a conductor containing paste layer 120 for resistance heating elements. The printed pattern was a concentric circle pattern as illustrated in FIG. 3.

Further the conductor containing paste B was filled into the portions which would be the conductor-filled through holes 19 for connecting external terminals 13. In this way, a filling layer 190 was formed.

Thirty seven green sheets on which no conductor containing paste was printed were stacked on upper part side (heating face) of the green sheet subjected to the above-mentioned processing, and the same thirteen green sheets were stacked on the lower side of the green sheet. The resultant was pressed at 130° C. and under a pressure of 8 MPa to form a lamination (see FIG. 12($a$)).

(4) Next, the resultant lamination was degreased at 600° C. in nitrogen gas for 5 hours and hot-pressed at 1890° C. and under a pressure of 15 MPa for 10 hours to obtain a ceramic plate having a thickness of 3 mm. This was cut off into a disk having a diameter of 230 mm to prepare a ceramic plate having, inside, resistance heating elements having a thickness of 6 μm and a width of 10 mm.

(5) Next, the ceramic plate obtained in the above-mentioned (4) was ground with a diamond grindstone. Subsequently a mask was placed thereon, and the plate was drilled to form a projected portion 16 and convex bodies 17 on upper side (heating face). In other words, a projected portion 16 having a height of 0.5 mm and a width of 10 mm was formed along the periphery of the ceramic substrate 11. Inside the projected portion 16, 200 columnar convex bodies 17 having a height of 0.3 mm and a diameter of 10 mm were formed (see FIG. 12($b$)). The ratio S of the contact area between the convex bodies 17 and a semiconductor wafer 39 to the area of the semiconductor wafer 39 was 50%.

Bottomed holes 14 for the insertion of thermocouples were made in the bottom face.

Through holes 15 for lifter pins for letting lifter pins 36 for carrying the semiconductor wafer pass through, and 20 through holes 18 for ventilation having a diameter of 0.5 mm were made.

Furthermore, an Ar—$O_2$—Cl plasma etcher (OAPM-301B, made by Tokyo Ohka Kogyo Co., Ltd.) was used to etch the surface of the ceramic substrate by plasma at 10 mTorr and 500 W for 50 minutes.

Next, the surface of the peripheral projected portion and the surface of the convex body were polished with diamond slurry (made by Maruto Instrument Co., Ltd.) having a diameter of 1 μm.

Figure 12:
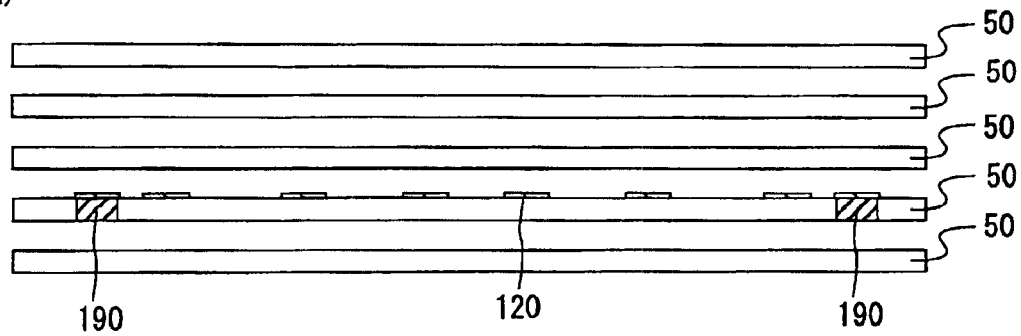
FIGS. 12(a) to 12(d) are sectional views which schematically show a part of the manufacturing method of the ceramic heater shown in FIG. 1.
Figure 12:
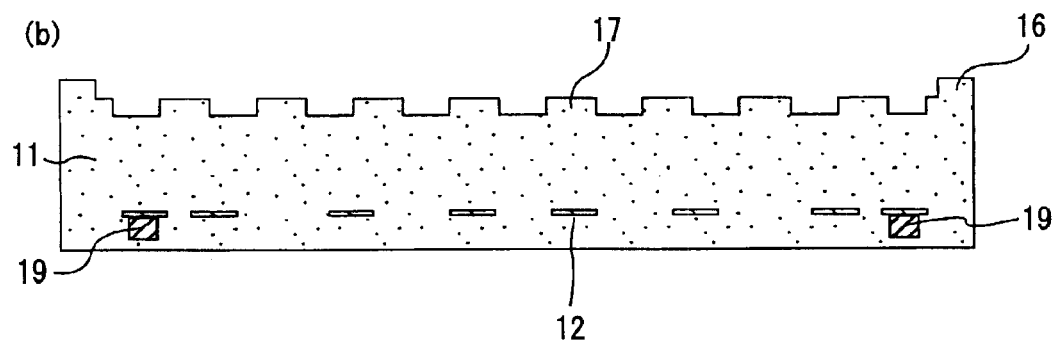
Figure 12:
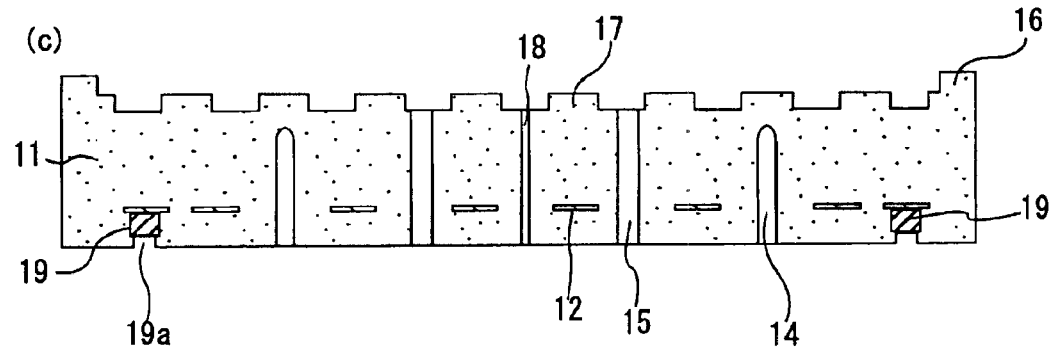
Figure 12:
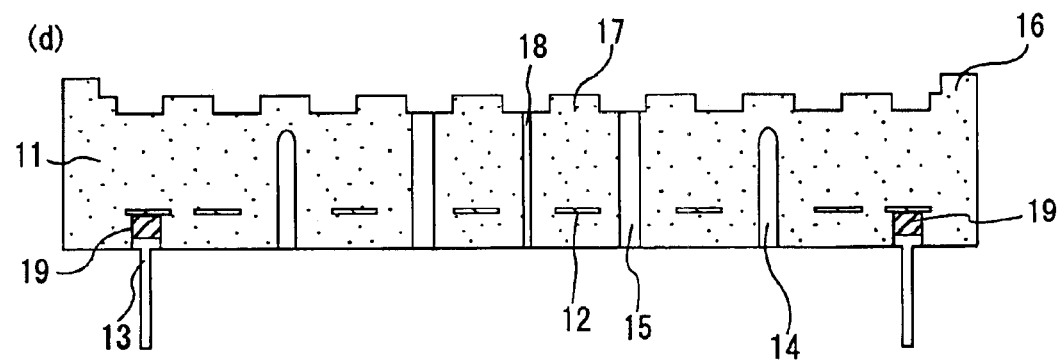

(6) Next, the portions where the conductor-filled through holes 19 were made were hollowed out to make blind holes 19$a$ (see FIG. 12($c$)). Brazing gold made of Ni—Au was used, heated and reflowed at 700° C. to connect external terminals 13 made of Kovar to the blind holes 19$a$ (see FIG. 12($d$)).

(7) Thermocouples (not illustrated) for controlling temperature were embedded in the bottomed holes 14 to obtain a ceramic heater 10.

EXAMPLE 2
Production of a Ceramic Heater (See FIGS. 4, 5 and 13)

(1) A composition made of 100 parts by weight of aluminum nitride powder (average particle diameter: 0.6 μm), 4 parts by weight of yttria (average particle diameter: 0.4 μm), 12 parts by weight of an acrylic binder and an alcohol was subjected to spray-drying to make a granular powder.

(2) Next, this granular powder was put into a mold and formed into a flat plate form to obtain a raw formed body (green).

(3) Next, the raw formed body was hot-pressed at 1800° C. and under a pressure of 20 MPa to obtain an aluminum nitride plate having a thickness of 3 mm.

Next, this plate was cut off into a disk having a diameter of 230 mm. In this way, a plate made of the ceramic (ceramic substrate 21) was prepared. This ceramic substrate 21 was drilled to make through holes 25 for lifter pins for letting lifter pins 36 for a silicon wafer pass through, and bottomed holes 24, in which thermocouples would be embedded. Furthermore, 20 through holes for ventilation having a diameter of 0.5 mm were made.

Furthermore, upper side of the ceramic substrate (heating face) was drilled to form the projected portion 26 and convex bodies 27 same as in Example 1 (see FIG. 13($a$)). Thereafter, grooves 26$a$ were made in the projected portion.

Furthermore, an Ar—$O_2$—Cl plasma etcher (OAPM-301B, made by Tokyo Ohka Kogyo Co., Ltd.) was used to plasma-etch the surface of the ceramic substrate at 10 mTorr and 500 W for 10 minutes.

Next, the surface of the peripheral projected portion and the surface of the convex body were polished with diamond slurry (made by Maruto Instrument Co., Ltd.) having a diameter of 0.01 μm.

(4) A conductor containing paste was printed on the ceramic substrate 21 obtained in the above-mentioned (3) by screen printing. The printed pattern was the concentric circle pattern same as in Example 1.

As the conductor containing paste, a paste having the following composition was used: 48% by weight of Ag; 21% by weight of Pt; 1.0% by weight of $SiO_2$; 1.2% by weight of $B_2O_3$; 4.1% by weight of ZnO; 3.4% by weight of PbO; 3.4% by weight of ethyl acetate and 17.9% by weight of butyl carbitol.

This conductor containing paste was a Ag—Pt paste, and silver particles therein had an average particle diameter of 4.5 μm, and were scaly. Pt particles therein had an average particle diameter of 0.5 μm and were spherical.

(5) Furthermore, a conductor containing paste layer of a resistance heating element pattern was formed, and subsequently the ceramic substrate 21 was heated and fired at 780° C. to sinter Ag and Pt in the conductor containing paste and bake them onto the ceramic substrate 21. Thus, resistance heating elements 22 were formed (see FIG. 13(b)). The resistance heating elements 22 had a thickness of 5 μm, a width of 2.4 mm and an area resistivity of 7.7 mΩ/□.

(6) The ceramic substrate 21 formed in the above-mentioned (5) was immersed into an electroless nickel plating bath consisting of an aqueous solution containing 80 g/l of nickel sulfate, 24 g/l of sodium hypophosphite, 12 g/l of sodium acetate, 8 g/l of boric acid, and 6 g/l of ammonium chloride to precipitate a metal covering layer (nickel layer) 120 having a thickness of 1 μm on the surface of the silver-lead resistance heating elements 22 (see FIG. 13(c)).

(7) Next, by screen printing, a silver-lead solder paste (made by Tanaka Kikinzoku Kogyo K. K.) was printed on portions onto which external terminals 23 for attaining connection to a power source would be set up, to form a solder layer (not illustrated).

Next, the external terminals 23 made of Kovar were put on the solder layer, heated and reflowed at 420° C. to attach the external terminals 23 onto the surface of the resistance heating elements 22 (see FIG. 13(d)).

(8) Thermocouples (not illustrated) for controlling temperature were fixed with a polyimide to obtain a ceramic heater 20.

EXAMPLE 3

A ceramic heater was produced in the same way as in Example 1 except that semispherical convex bodies 17 (see FIG. 7(c)) having a height of 0.3 mm were formed, the surface was etched with a 0.1 N aqueous solution of HF/HNO$_3$ mixed acid and polished with a diamond paste having an average particle diameter of 5 μm.

EXAMPLE 4

Production of a Ceramic Heater (1) First, a ceramic plate having resistance heating elements formed inside was produced in the same way as in the above-mentioned (1) to (4) in Example 1.

Upper side of the ceramic plate (heating face) was drilled under the same conditions as in (5) in Example 1 to form convex bodies similar to convex bodies 17 in Example 1 on the heating face. No projected portion was formed along the periphery of the heating face.

Bottomed holes, into which thermocouples would be inserted, were made in the bottom face, and further through holes for lifter pins for letting lifter pins for carrying a semiconductor wafer pass through, and 20 through holes for ventilation having a diameter of 0.5 mm were made therein.

(2) Next, the surface of the heating face in which the convex bodies were formed was etched with a 0.1 N aqueous solution of HF/HNO$_3$ mixed acid for 50 minutes.

(3) Upper part of the convex body was polished with a diamond paste having a diameter of 10 μm to produce a ceramic substrate wherein resistance heating elements were formed inside, a large number of the convex bodies were formed on the heating face and further a roughened face was formed on a non convex body formed portion.

(4) Thereafter, in the same way as in (6) and (7) in Example 1, blind holes were made in the bottom face of the ceramic substrate and external terminals were connected thereto. Thereafter, by embedding thermocouples for controlling temperature in the bottomed holes, a ceramic heater was produced.

EXAMPLE 5

Production of a Ceramic Heater (See FIGS. 14 and 15)

(1) First, in the same way as in (1) to (6) in Example 2, a ceramic substrate 81' was formed wherein convex bodies 87 were formed on upper side (heating face) and resistance heating elements 82 covered with a metal covering layer 820 were formed on the bottom face. No projected portion was formed along the periphery of the heating face.

Bottomed holes 84, into which thermocouples would be inserted, were made in the bottom face of the ceramic substrate 81', and further through holes 85 for lifter pins for letting lifter pins for carrying a semiconductor wafer pass through, and 20 through holes 88 for ventilation having a diameter of 0.5 mm were made therein.

(2) Furthermore, an Ar—O$_2$—Cl plasma etcher (OAPM-301B, made by Tokyo Ohka Kogyo Co., Ltd.) was used to plasma-etch the surface of the ceramic substrate at 10 mTorr and 500 W for 50 minutes.

(3) Upper part of the convex body 87, the surface of the peripheral projected portion and the surface of the convex body were polished with diamond slurry (made by Maruto Instrument Co., Ltd.) having a diameter of 1 μm, so as to produce a ceramic substrate wherein the resistance heating elements were formed on the bottom face, a large number of convex bodies were formed on the heating face and further a roughened face was formed on a non convex body formed portion.

(4) Thereafter, in the same way as in (6) and (7) in Example 1, blind holes were made in the bottom face of the ceramic substrate and external terminals were connected thereto. Thereafter, by embedding thermocouples for controlling temperature in the bottomed holes, a ceramic heater was produced.

EXAMPLE 6

(1) The following paste was used to conduct formation by doctor blade method, to obtain green sheets with a thickness of 0.47 mm: a paste obtained by mixing 100 parts by weight of SiC powder (made by Yakushima Denko Co. Ltd., average particle diameter: 1.1 μm), 4 parts by weight of B$_4$C, 11.5 parts by weight of an acrylic resin binder, 0.5 part by weight of a dispersant and 53 parts by weight of alcohol containing 1-butanol and ethanol. Further, 80 parts by weight of borosilicate glass having an average particle diameter of 1.0 μm, 5 parts by weight of polyethylene glycol, and 15 parts by weight of alcohol were mixed to yield a glass paste, and this glass paste was applied to the surface.

(2) Next, the green sheet was dried at 80° C. for 5 hours, and subsequently portions which would be conductor-filled through holes 19 were made by punching.

(3) The following were mixed to prepare a conductor containing paste A: 100 parts by weight of tungsten carbide particles having an average particle diameter of 1 μm, 3.0 parts by weight of an acrylic binder, 3.5 parts by weight of α-terpineol solvent, and 0.3 part by weight of a dispersant.

The following were mixed to prepare a conductor containing paste B: 100 parts by weight of tungsten particles having an average particle diameter of 3 μm, 1.9 parts by weight of an acrylic binder, 3.7 parts by weight of α-terpineol solvent, and 0.2 part by weight of a dispersant.

This conductor containing paste A was printed on the green sheet by screen printing, so as to form a conductor containing paste layer 120 for resistance heating elements. The printed pattern was a concentric circle pattern as illustrated in FIG. 3.

The conductor containing paste B was filled into the portions which would be the conductor-filled through holes 19 for connecting external terminals 13. In this way, a filling layer 190 was formed.

The green sheet subjected to the above-mentioned processing was coated with the glass paste, and then thirty seven green sheets on which no conductor containing paste was printed were stacked on upper part side (heating face) of the green sheet subjected to the above-mentioned processing, and the same thirteen green sheets were stacked on the lower side of the green sheet. The resultant was pressed at 130° C. and under a pressure of 8 MPa to form a lamination (see FIG. 12(a)).

(4) Next, the resultant lamination was degreased at 600° C. in nitrogen gas for 5 hours and hot-pressed at 1890° C. and under a pressure of 15 MPa for 10 hours to obtain a ceramic plate having a thickness of 3 mm. This was cut off into a disk having a diameter of 230 mm to prepare a ceramic plate having therein resistance heating elements with a thickness of 6 µm and a width of 10 mm.

(5) Next, the ceramic plate obtained in the above-mentioned (4) was ground with a diamond grindstone. Subsequently a mask was placed thereon, and a projected portion 16 and convex bodies 17 were formed on upper side (heating face) by drilling. In other words, a projected portion 16 having a height of 0.5 mm and a width of 10 mm was formed along the periphery of the ceramic substrate 11, and inside the projected portion 16, 200 columnar convex bodies 17 having a height of 0.3 mm and a diameter of 10 mm were formed (see FIG. 12(b)). The ratio S of the contact area between the convex bodies 17 and a semiconductor wafer 39 to the area of the semiconductor wafer 39 was 50%.

Bottomed holes 14 for the insertion of thermocouples were made in the bottom face.

Further, through holes 15 for lifter pins for letting lifter pins 36 for carrying the semiconductor wafer pass through, and 20 through holes 18 for ventilation having a diameter of 0.5 mm were made.

The plate was etched with a 0.1 N aqueous solution of $HF/HNO_3$ mixed acid for 50 minutes.

Next, the surface of the peripheral projected portion and the surface of the convex body were polished with diamond slurry (made by Maruto Instrument Co., Ltd.) having an average particle diameter of 10 µm.

A sputtering device (ASP-34, made by Showa Shinku Co., Ltd.) was used to form a film of magnesium fluoride having a thickness of 2 µm on the surface.

(6) Next, the portions where the conductor-filled through holes 19 were made were hollowed out to make blind holes 19a (see FIG. 12(c)). Brazing gold made of Ni—Au was used, heated and reflowed at 700° C. to connect external terminals 13 made of Kovar to the blind holes 19a (see FIG. 12(d)).

(7) Thermocouples (not illustrated) for controlling temperature were embedded in the bottomed holes 14 to obtain a ceramic heater 10.

EXAMPLE 7

The present example was performed in the same way as in Example 6 but etching with a 0.1 N aqueous solution of $HF/HNO_3$ mixed acid was further performed for 50 minutes.

Next, the surface of the peripheral projected portion and the surface of the convex body were polished with diamond slurry (made by Maruto Instrument Co., Ltd.) having an average particle diameter of 10 µm.

Furthermore, a sputtering device (ASP-34, made by Showa Shinku Co., Ltd.) was used to form a film of yttrium oxide having a thickness of 5 µm on the surface.

EXAMPLE 8

The present example was performed in the same way as in Example 1 but an Ar—$O_2$—Cl plasma etcher (OAPM-301B, made by Tokyo Ohka Kogyo Co., Ltd.) was used to plasma-etch the surface of the ceramic substrate at 10 mTorr and 500 W for 50 minutes.

Next, the surface of the peripheral projected portion and the surface of the convex body were polished with diamond slurry (made by Maruto Instrument Co., Ltd.) having a diameter of 0.02 µm.

EXAMPLE 9

The present example was performed in the same way as in Example 1 but etching with a 0.1 N aqueous solution of $HF/HNO_3$ mixed acid was further performed for 40 minutes.

Next, the surface of the peripheral projected portion and the surface of the convex body were polished with diamond slurry (made by Maruto Instrument Co., Ltd.) having an average particle diameter of 50 µm.

COMPARATIVE EXAMPLE 1

A ceramic heater was produced in the same way as in Example 1 except that the projected portion 16 and the through holes 18 for ventilation were formed but the convex bodies 17 were not formed.

COMPARATIVE EXAMPLE 2

The example was performed in the same way as in Example 1 except that the convex bodies 17 and the through holes 18 for ventilation were formed but the projected portion 16 was not formed, and the surface was etched with a 0.1 N aqueous solution of $HF/HNO_3$ mixed acid for 60 minutes. Upper part of the convex body was then polished with a diamond paste having a diameter of 1 µm to produce a ceramic substrate wherein resistance heating elements were formed inside, the convex bodies in large numbers were formed on a heating face, and a roughened face was formed on a non convex body formed portion.

COMPARATIVE EXAMPLE 3

The present comparative example was performed in the same way as in Example 1 but an Ar—$O_2$—Cl plasma etcher (OAPM-301B, made by Tokyo Ohka Kogyo Co., Ltd.) was used to plasma-etch the surface of the ceramic substrate at 10 mTorr and 500 W for 8 minutes.

Next, the surface of the peripheral projected portion and the surface of the convex body were polished with diamond slurry (made by Maruto Instrument Co., Ltd.) having a diameter of 0.5 µm.

COMPARATIVE EXAMPLE 4

The present comparative example was performed in the same way as in Example 1 but the surface of the heating face on which the convex bodies were formed was etched with a 0.1 N aqueous solution of $HF/HNO_3$ mixed acid for 60 minutes.

Upper part of the convex body was then polished with a diamond paste having a diameter of 1 µm to produce a ceramic substrate wherein resistance heating elements were formed inside, the convex bodies in large numbers were formed on the heating face, and a roughened face was formed on a non convex body formed portion.

COMPARATIVE EXAMPLE 5

The present comparative example was performed in the same way as in Example 1 but the convex bodies and the peripheral projected portion were formed by sandblast. First, a mask was placed on sites for the projected portion and the convex bodies and sandblast treatment was conducted with SiC having an average particle diameter of 5 µm. Furthermore, the mask was removed to conduct sandblast in order to remove undercut.

COMPARATIVE EXAMPLE 6

The present comparative example was performed in the same way as in Example 1 but the convex bodies and the peripheral projected portion were formed by CVD. First, the surface of the ceramic substrate was ground with diamond grindstone having 800 mesh, and a mask wherein sites for the projected portion and the convex bodies were opened was put. Aluminum chloride and ammonia were put into a container and the container was heated to 1300° C. under a pressure of 1 kPa to synthesize AlN in gas phase. In this way, the convex bodies and the peripheral projected portion were formed.

COMPARATIVE EXAMPLE 7

The present comparative example was performed in the same way as in Example 1 but the convex bodies and the peripheral projected portion were formed by sandblast. First, a mask was put on sites for the projected portion and the convex bodies and sandblast treatment was conducted with SiC having an average particle diameter of 5 µm. Furthermore, the mask was removed to conduct sandblast in order to remove undercut. The height of the convex bodies was made equal to that of the peripheral projected portion.

Each of the ceramic heaters according to Examples 1 to 9 and Comparative Examples 1 to 7 was put on a supporting case 90 illustrated in FIG. 5, and subsequently silicon wafers were placed thereon, and electric current was sent thereto, so as to raise the temperature thereof to 350° C. The ceramic heaters were evaluated by the following methods. The supporting case was formed to make it possible to blow a heating medium directly into the through holes 18 for ventilation.

When the silicon wafers were placed, the silicon wafers were fitted into the projected portions and placed on the convex bodies in the ceramic heaters according to Examples 1 to 3 and 6 to 9. The silicon wafers were placed on the convex bodies in the ceramic heaters according to Examples 4 and 5. The temperatures of the silicon wafers were then raised. On the other hand, in the ceramic heater according to Comparative Example 1, the silicon wafer was fitted into the projected portion and placed directly on the ceramic heater, and the temperature thereof was raised. In the ceramic heaters according to Comparative Examples 2 to 6, the silicon wafers were placed on the convex bodies, and the temperatures thereof were raised. In Comparative Example 7, the wafer was placed on the convex bodies and the peripheral projected portion.

The temperatures of the ceramic heaters according to Examples 1 to 9 and Comparative Examples 1 to 7 were raised while the heating elements were heated to 350° C. to supply atmospheric gas as a heating medium from the through holes for ventilation. Evaluation method (1) Temperature Rising Time The temperature rising time, when the temperature of each of the silicon wafers was raised from room temperature to 300° C., was measured. When the temperature was raised, the highest temperature and the lowest temperature of the silicon wafer were measured by putting a sensor wafer wherein thermocouples were set to 21 positions thereon. The average temperature thereof was calculated. The time until the average temperature became 350° C. was defined as the temperature rising time.

(2) In-Plane Temperature Evenness at a Stationary Time

The temperature of each of the ceramic heaters was raised to 350° C., and subsequently a sensor wafer wherein thermocouples were set to 21 positions was put thereon, so as to measure the highest temperature and the lowest temperature. The difference between the temperatures was calculated. The results are shown in Table 1.

TABLE 1

| | Existence of peripheral projected portion | Surface roughness of the convex bodies (µm) | Surface roughness of the non convex body formed portion (µm) | Temperature rising time (second) | Temperature difference at a stationary time (° C.) |
|---|---|---|---|---|---|
| Example 1 | Formed | 1 | 5 | 41 | 0.4 |
| Example 2 | Formed | 0.03 | 1 | 40 | 0.5 |
| Example 3 | Formed | 5 | 10 | 41 | 0.4 |
| Example 4 | Not formed | 10 | 100 | 55 | 1.1 |
| Example 5 | Not formed | 1 | 5 | 56 | 1.0 |
| Example 6 | Formed | 8 | 80 | 40 | 0.6 |
| Example 7 | Formed | 5 | 95 | 41 | 0.5 |
| Example 8 | Formed | 0.01 | 5 | 43 | 1.2 |
| Example 9 | Formed | 20 | 80 | 40 | 1.1 |
| Comparative Example 1 | Formed | — | — | 60 | 5.0 |
| Comparative Example 2 | Not formed | 1 | 110 | 90 | 6.5 |
| Comparative Example 3 | Formed | 0.5 | 0.8 | 75 | 5.8 |
| Comparative Example 4 | Formed | 1 | 110 | 75 | 6.1 |
| Comparative Example 5 | Formed | 5 | 5 | 75 | 5.9 |
| Comparative Example 6 | Formed | 1000 | 5 | 85 | 10 |
| Comparative Example 7 | Formed | 5 | 5 | 80 | 3.0 |

Note)
Temperature difference at a stationary time: difference between the highest temperature and the lowest temperature at a stationary time As shown in Table 1, the ceramic heaters according to Examples 1 to 3, 6 and 7 were able to raise the temperatures of the silicon wafers to 350° C. in about 40 seconds. The temperature difference in each of the wafers was from 0.4° C. to 0.6° C., which exhibited good temperature evenness. This is because the wafer was fitted into the peripheral projected portion, the wafer adhered closely to the convex bodies, and the surface roughness of the non convex body formed portion was large not to cause heated gas to flow. In Examples 4 and 5, no peripheral projected portion was formed but the surface roughness was adjusted. Therefore, the temperature difference was from 1.0° C. to 1.1° C., which exhibited relatively good temperature evenness. However, the temperature rising time was as long as 55 to 56 seconds. In Examples 8 and 9, the surface roughnesses of upper faces of the convex bodies were too large or too small. Therefore, the temperature of the wafer was from 1.1° C. to 1.2° C., which was somewhat large.

In the ceramic heater according to Comparative Example 1, no convex bodies were formed. Therefore, the contact area between the wafer and the heating face was small, and the temperature rising time was also long. Since the flow of heated gas was not controlled, the in-plane temperature difference of the silicon wafer was large. In the ceramic heater according to Comparative Example 2, the surface roughness was not adjusted and no peripheral projected portion was formed; therefore, heated gas flowed out and the temperature rising time was long, and further the in-plane temperature difference of the silicon wafer was also large. In Comparative Examples 3 and 4, the surface roughness of the non convex body formed portion was too large or too small; therefore, heat was accumulated too much or heated gas flowed adversely so that the in-plane temperature difference of the silicon wafer was large. In Comparative Example 5, the convex bodies were formed by sandblast treatment but the surface roughness of the convex bodies became equivalent to that of the non convex body formed portion by the sandblast. It appears that as the surface roughness of the non convex body formed portion becomes larger, it is necessary to improve adhesiveness between the silicon wafer and the convex bodies. This is based on the following reason: as the surface roughness of the non convex body formed portion becomes larger, the fluidity of heated gas is more suppressed; it is necessary to prevent this heated gas from flowing out from a gap between the silicon wafer and upper face of the convex body. Accordingly, when the surface roughness of the convex body and the surface roughness of the non convex body formed portion become equal, the heated gas flows out from the gap between the silicon wafer and the convex bodies so that the in-plane temperature difference of the silicon wafer becomes large.

In Comparative Example 6, AlN was synthesized in gas phase by CVD. Synthesis in gas phase causes crystal growth; therefore, the surface roughness became large. For this reason, the contact area between the silicon wafer and the convex bodies was not sufficiently ensured. The present inventor attempted to roughen the surface of the convex body. However, the convex body exfoliated.

In Comparative Example 7, the silicon wafer was placed on the peripheral projected portion. Therefore, the circumference of the side face of the wafer contacted atmospheric gas so that the temperature dropped.

INDUSTRIAL APPLICABILITY

As described above, the ceramic substrate of the first aspect of the present invention has a projected portion for fitting a semiconductor wafer along the periphery thereof and a large number of convex bodies, which contact the semiconductor wafer, are formed inside the projected portion. Therefore, heat conducted by radiation from the ceramic substrate and convection of atmospheric gas is conducted to the semiconductor wafer and the like without causing the heat to escape. Thus, the temperature can be promptly raised. The temperature distribution on the surface of the ceramic substrate is not reflected on the semiconductor wafer and the like and the temperature in the heating face can be made even.

The ceramic substrate of the second aspect of the present invention has a large number of convex bodies formed on a heating face on which an object to be heated, such as a semiconductor wafer, is placed and further a roughened face with Rmax of 1 to 100 μm formed on a non convex body formed portion, so that atmospheric gas present between the non convex body formed portion and the semiconductor wafer can be caused to remain. Heat conducted by radiation from the ceramic substrate and convection of atmospheric gas is conducted to the semiconductor wafer and the like without causing the heat to escape. Thus, the temperature can be promptly raised. The temperature distribution on the surface of the ceramic substrate is not reflected on the semiconductor wafer and the like and the temperature in the heating face can be made even.

Furthermore, by making plural through holes in the non convex body formed portions of the ceramic substrates of the first and second aspects of the present invention and supplying a heating medium such as hot air, the temperature of the ceramic substrate can be promptly raised.

According to the method for producing a ceramic substrate of the present invention, the ceramic substrate of the second aspect of the present invention having the following characteristics can be produced: a large number of convex bodies are formed on a heating face on which an object to be heated, such as a semiconductor wafer, is placed and further a roughened face having the Rmax of 1 to 100 μm is formed on a non convex body formed portion, so that heat conducted by radiation from the ceramic substrate and convection of atmospheric gas is conducted to the semiconductor wafer and the like without causing the heat to escape; the temperature can be promptly raised; and the temperature distribution on the surface of the ceramic substrate is not reflected on the semiconductor wafer and the like and the temperature in the heating face can be made even.

What is claimed is:

1. A ceramic substrate for a semiconductor-producing/examining device, comprising:
   a resistance heating element formed on a surface of the ceramic substrate or inside the ceramic substrate; and
   a plurality of convex bodies configured to make contact with a semiconductor wafer and formed on a heating face of the ceramic substrate, wherein,
   each of the plurality of convex bodies includes an upper plane configured to contact the semiconductor wafer, and
   the surface roughness Rmax, according to JIS B 0601, of a non convex body formed portion of the ceramic substrate is from 1 to 100 μm, and is larger than the surface roughness Rmax of each upper plane of the plurality of convex bodies.

2. The ceramic substrate for a semiconductor-producing/examining device according to claim 1, wherein the surface roughness Rmax, according to JIS B 0601, of each upper plane of the plurality of convex bodies is smaller than the Rmax of the non convex body formed portion and is from 0.03 to 10 μm.

3. The ceramic substrate for a semiconductor-producing/examining device according to claim 2, further comprising:
   a plurality of through holes each including an opening positioned at the non convex body formed portion.

4. The ceramic substrate for a semiconductor-producing/examining device according to claim 1, further comprising:
   a plurality of through holes each including an opening positioned at the non convex body formed portion.

5. A method for manufacturing a ceramic substrate for a semiconductor-producing/examining device, the ceramic substrate including,
   a resistance heating element formed on a surface of the ceramic substrate or inside the ceramic substrate, and
   a plurality of convex bodies configured to contact a semiconductor wafer and positioned on a heating face of the ceramic substrate, an upper part of the convex body including a plane, the method comprising:

producing a ceramic substrate by forming the plurality of convex bodies on the heating face and by forming the resistance heating element on the surface or inside the ceramic substrate;

forming a roughened face on an upper part of one of the plurality of convex bodies and on a non convex body formed portion of the ceramic substrate by at least one of a physical method and a chemical method so as to set a surface roughness Rmax, according to JIS B 0601, of the non convex body formed portion to 1 to 100 µm; and subjecting the upper part to a smoothing treatment so as to make the surface roughness Rmax of the upper part smaller than the surface roughness Rmax of the non convex body formed portion.

6. A ceramic substrate for a semiconductor-producing/examining device, comprising:

a heating face including a non-convex first surface and a plurality of convex bodies;

a second surface positioned opposite of the heating face;

a resistance heating element formed on the second surface or inside the ceramic substrate;

a projected portion formed along a periphery of the first surface and including a sidewall configured to contact an edge portion of the semiconductor wafer; and a plurality of through holes each including an opening positioned at the first surface, wherein the plurality of convex bodies are configured to contact the semiconductor wafer, and wherein the projected portion includes a groove configured to allow a discharging of a medium introduced to a space between the first surface and the semiconductor wafer via at least one of the plurality of through holes.

* * * * *